(12) United States Patent
Kukal et al.

(10) Patent No.: US 9,881,119 B1
(45) Date of Patent: Jan. 30, 2018

(54) METHODS, SYSTEMS, AND COMPUTER PROGRAM PRODUCT FOR CONSTRUCTING A SIMULATION SCHEMATIC OF AN ELECTRONIC DESIGN ACROSS MULTIPLE DESIGN FABRICS

(71) Applicant: Cadence Design Systems, Inc., San Jose, CA (US)

(72) Inventors: Taranjit Singh Kukal, Delhi (IN); Steven R. Durrill, Campbell, CA (US); Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 116 days.

(21) Appl. No.: 14/754,535

(22) Filed: Jun. 29, 2015

(51) Int. Cl.
*G06F 9/455* (2006.01)
*G06F 17/50* (2006.01)

(52) U.S. Cl.
CPC ...... *G06F 17/5081* (2013.01); *G06F 17/5036* (2013.01)

(58) Field of Classification Search
USPC ........................................................ 716/111
See application file for complete search history.

(56) References Cited

U.S. PATENT DOCUMENTS

| 4,457,027 | A | 7/1984 | Gladstone |
| 5,396,435 | A | 3/1995 | Ginetti |
| 5,426,591 | A | 6/1995 | Ginetti et al. |
| 5,633,803 | A | 5/1997 | Silve et al. |
| 5,638,290 | A | 6/1997 | Ginetti et al. |
| 5,726,902 | A | 3/1998 | Mahmood et al. |
| 5,751,596 | A | 5/1998 | Ginetti et al. |
| 5,764,525 | A | 6/1998 | Mahmood et al. |
| 5,825,658 | A | 10/1998 | Ginetti et al. |
| 5,841,663 | A | 11/1998 | Sharma et al. |
| 5,896,299 | A | 4/1999 | Ginetti et al. |
| 5,956,257 | A | 9/1999 | Ginetti et al. |
| 6,086,621 | A | 7/2000 | Ginetti et al. |
| 6,113,647 | A | 9/2000 | Silve et al. |
| 6,145,117 | A | 11/2000 | Eng |
| 6,170,080 | B1 | 1/2001 | Ginetti et al. |

(Continued)

OTHER PUBLICATIONS

Hon-Chi Ng, "Cpr E 305 Laboratory Tutorial ¾ Verilog Syntax: Summary of Verilog Syntax" Last Updated: Feb. 7, 2001.

(Continued)

*Primary Examiner* — Eric Lee
(74) *Attorney, Agent, or Firm* — Vista IP Law Group, LLP

(57) ABSTRACT

Disclosed are techniques for generating a parasitic-aware simulation schematic across multiple design fabrics. These techniques identify a first extracted model from existing extracted models for a first circuit component design in a first layout in a first design fabric of an electronic design that spans across multiple design fabrics. These techniques further generate a simulation schematic by inserting the first extracted model into the simulation schematic. In addition, a simulation may be performed with the simulation schematic to generate simulation results. Schematic models, if existing, may also be used to revise the simulation schematic. For circuit component designs corresponding to no extract models or schematic models, one or more extracted models placeable in the simulation schematic may also be constructed to update the simulation schematic.

21 Claims, 21 Drawing Sheets

(56) References Cited

U.S. PATENT DOCUMENTS

| | | |
|---|---|---|
| 6,353,612 B1 | 3/2002 | Zhu |
| 6,378,116 B1 | 4/2002 | Ginetti |
| 6,401,128 B1 | 6/2002 | Stai |
| 6,405,345 B1 | 6/2002 | Ginetti |
| 6,519,743 B1 | 2/2003 | Nauts et al. |
| 6,622,290 B1 | 9/2003 | Ginetti et al. |
| 6,622,291 B1 | 9/2003 | Ginetti |
| 7,143,341 B1 | 11/2006 | Kohli |
| 7,168,041 B1 | 1/2007 | Durrill et al. |
| 7,257,799 B2 | 8/2007 | McKenney |
| 7,468,982 B2 | 12/2008 | Mehra |
| 7,490,309 B1 | 2/2009 | Gonzalesz et al. |
| 7,555,739 B1 | 6/2009 | Ginetti et al. |
| 7,634,743 B1 | 12/2009 | Ginetti |
| 7,711,767 B2 | 5/2010 | Agrawal |
| 7,779,286 B1 | 8/2010 | Pritchard |
| 7,802,221 B1 | 9/2010 | Brink |
| 7,949,987 B1 | 5/2011 | Ginetti et al. |
| 7,971,175 B2 | 6/2011 | Ginetti |
| 7,971,178 B1 | 6/2011 | Marwah et al. |
| 7,990,375 B2 | 8/2011 | Kohli et al. |
| 8,046,730 B1 | 10/2011 | Ferguson et al. |
| 8,136,071 B2 | 3/2012 | Solomon |
| 8,145,458 B1 | 3/2012 | Kukal et al. |
| 8,191,035 B1 | 5/2012 | Van Brink |
| 8,255,845 B2 | 8/2012 | Ginetti |
| 8,261,228 B1 | 9/2012 | Gopalakrishnan et al. |
| 8,271,933 B1 | 9/2012 | Kohli et al. |
| 8,281,272 B1 | 10/2012 | Ginetti |
| 8,286,025 B1 | 10/2012 | Pritchard |
| 8,286,110 B1 | 10/2012 | Kukal et al. |
| 8,316,337 B2 | 11/2012 | Bhattacharya et al. |
| 8,316,342 B1 | 11/2012 | Kukal et al. |
| 8,347,261 B2 | 1/2013 | Ginetti et al. |
| 8,364,656 B2 | 1/2013 | Arora et al. |
| 8,438,524 B1 | 5/2013 | Kohli et al. |
| 8,452,582 B1 | 5/2013 | Al-hawari et al. |
| 8,453,136 B1 | 5/2013 | Hahn et al. |
| 8,479,134 B2 | 7/2013 | Bhattacharya et al. |
| 8,521,483 B1 | 8/2013 | Kukal et al. |
| 8,527,929 B2 | 9/2013 | Bhattacharya et al. |
| 8,527,934 B2 | 9/2013 | Ginetti et al. |
| 8,566,767 B1 | 10/2013 | Kukal et al. |
| 8,594,988 B1 | 11/2013 | Spyrou et al. |
| 8,595,671 B2 | 11/2013 | He |
| 8,631,181 B2 | 1/2014 | Feehrer |
| 8,645,894 B1 | 2/2014 | Kukal et al. |
| 8,656,329 B1 | 2/2014 | Kukal et al. |
| 8,719,754 B1 | 5/2014 | Ginetti |
| 8,732,636 B2 | 5/2014 | Ginetti et al. |
| 8,732,651 B1 | 5/2014 | Kukal et al. |
| 8,762,906 B2 | 6/2014 | Ginetti et al. |
| 8,769,455 B1 | 7/2014 | Singh et al. |
| 8,806,405 B2 | 8/2014 | Colwell |
| 8,898,039 B1 | 11/2014 | Kukal et al. |
| 8,910,100 B1 | 12/2014 | Wilson et al. |
| 8,930,878 B1 | 1/2015 | Leef |
| 9,165,931 B1 | 10/2015 | Schmit |
| 9,223,915 B1 | 12/2015 | Ginetti et al. |
| 9,348,960 B1 | 5/2016 | Ginetti |
| 9,361,415 B1 | 6/2016 | Ginetti et al. |
| 9,449,130 B1 | 9/2016 | Kukal |
| 2003/0051222 A1 | 3/2003 | Williams et al. |
| 2003/0196182 A1 | 10/2003 | Hahn |
| 2004/0034842 A1 | 2/2004 | Mantey |
| 2004/0156322 A1 | 8/2004 | Mehra |
| 2005/0273732 A1 | 12/2005 | Xu |
| 2006/0111884 A1 | 5/2006 | McGaughy et al. |
| 2006/0288323 A1* | 12/2006 | Birch ............ G06F 17/5077 716/129 |
| 2007/0229537 A1 | 10/2007 | Kohli et al. |
| 2008/0009412 A1 | 4/2008 | Osann |
| 2008/0301600 A1 | 12/2008 | Kumagai |
| 2009/0007031 A1 | 1/2009 | Ginetti et al. |
| 2010/0031209 A1 | 2/2010 | Luan et al. |
| 2010/0115207 A1 | 5/2010 | Arora et al. |
| 2010/0306729 A1 | 12/2010 | Ginetti |
| 2011/0041106 A1 | 2/2011 | Li et al. |
| 2011/0061034 A1 | 3/2011 | Ginetti et al. |
| 2011/0153288 A1 | 6/2011 | Bhattacharya et al. |
| 2011/0153289 A1 | 6/2011 | Bhattacharya et al. |
| 2011/0154276 A1 | 6/2011 | Bhattacharya et al. |
| 2011/0161899 A1 | 6/2011 | Ginetti et al. |
| 2011/0161900 A1 | 6/2011 | Ginetti et al. |
| 2011/0173582 A1* | 7/2011 | Bhattacharya ...... G06F 17/5081 716/106 |
| 2012/0047434 A1 | 2/2012 | Ginetti |
| 2012/0068229 A1 | 3/2012 | Bemanian |
| 2013/0097572 A1 | 4/2013 | Ginetti et al. |
| 2013/0246900 A1 | 9/2013 | Ginetti et al. |
| 2013/0290834 A1 | 10/2013 | Ginetti et al. |
| 2014/0103959 A1 | 4/2014 | Andreev |
| 2014/0103985 A1 | 4/2014 | Andreev |
| 2014/0123094 A1 | 5/2014 | Colwell et al. |
| 2014/0223402 A1 | 8/2014 | Satou |

OTHER PUBLICATIONS

Stuart Sutherland, "Verilog HDL: Quick Reference Guide" 2001.
"Summary of Verilog Syntax" URL: http://www.verilogtutorial.info/chapter_3.htm, 2007, Accessed on Sep. 2, 2014.
Non-Final Office Action dated Apr. 13, 2015 for U.S. Appl. No. 14/503,408.
Non-Final Office Action dated Apr. 16, 2015 for U.S. Appl. No. 14/503,407.
Notice of Allowance dated Aug. 21, 2015 for U.S. Appl. No. 14/503,406.
Notice of Allowance dated Oct. 28, 2015 for U.S. Appl. No. 14/503,407.
Notice of Allowance dated Oct. 29, 2015 for U.S. Appl. No. 14/503,408.
Ex-parte Quayle Action dated Nov. 2, 2015 for U.S. Appl. No. 14/503,404.
Notice of Allowance dated Jan. 22, 2016 for U.S. Appl. No. 14/503,404.
Ex-parte Quayle Action dated Nov. 27, 2015 for U.S. Appl. No. 14/503,404.
Kahng et al.;"Improved on-chip router analytical power and area modeling"; Year: 2010; 2010 15th Asia and South Pacific Design Automation Conference (ASP-DAC); , pp. 241-246.
Non-Final Office Action dated Apr. 12, 2017 for U.S. Appl. No. 14/871,735.
"Application Note: Best Practices for S-Parameter Extraction to Improve Time-Domain Convergence with Allegro Sigrity Tools", Cadence Design Systems, Inc., Nov. 2013.
"Guidelines for Robust S-Parameter Model Development Application Note, Product Version 15.2", Cadence Design Systems, Inc., Jun. 2004.
Creech, Joseph. "S-Parameters Allow High-Frequency Verification of RF Switch Models." Analog Dialogue 45.10 (2011): 1-4.
Ex-parte Quayle Action dated Aug. 21, 2017 for U.S. Appl. No. 15/205,593.
Notice of Allowance dated Sep. 20, 2017 for U.S. Appl. No. 14/871,735.
Notice of Allowance dated Nov. 22, 2017 for U.S. Appl. No. 15/205,593.

* cited by examiner

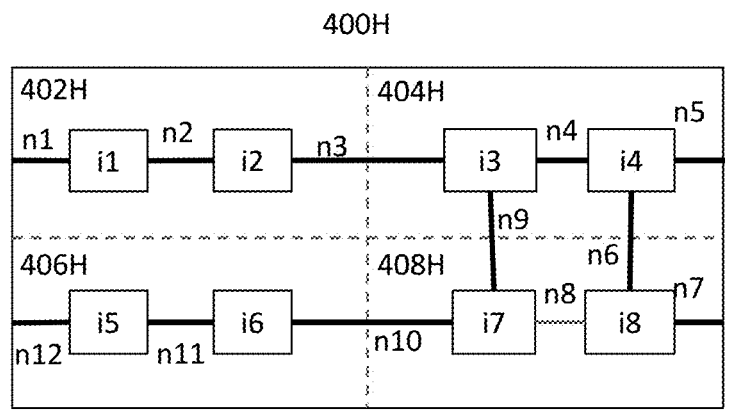
FIG. 4I
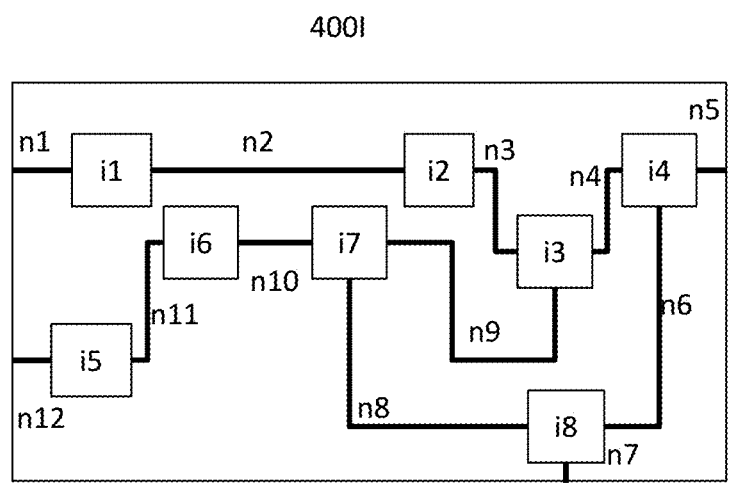

METHODS, SYSTEMS, AND COMPUTER PROGRAM PRODUCT FOR CONSTRUCTING A SIMULATION SCHEMATIC OF AN ELECTRONIC DESIGN ACROSS MULTIPLE DESIGN FABRICS

CROSS REFERENCE TO RELATED PATENT APPLICATIONS

This application is related to U.S. patent application Ser. No. 14/503,408 filed concurrently and entitled "METHODS, SYSTEMS, AND ARTICLES OF MANUFACTURE FOR BACK ANNOTATING AND VISUALIZING PARASITIC MODELS OF ELECTRONIC DESIGNS", U.S. patent application Ser. No. 14/503,403 filed concurrently and entitled "METHODS, SYSTEMS, AND ARTICLES OF MANUFACTURE FOR IMPLEMENTING A MULTI-FABRIC ELECTRONIC DESIGN SPANNING ACROSS MULTIPLE DESIGN FABRICS", U.S. patent application Ser. No. 14/503,404 filed concurrently and entitled "METHOD, SYSTEM, AND COMPUTER PROGRAM PRODUCT FOR CHECKING, VERIFYING, OR TESTING A MULTI-FABRIC ELECTRONIC DESIGN SPANNING ACROSS MULTIPLE DESIGN FABRICS", U.S. patent application Ser. No. 14/503,406 filed concurrently and entitled "METHOD, SYSTEM, AND COMPUTER PROGRAM PRODUCT FOR PROBING OR NETLISTING A MULTI-FABRIC ELECTRONIC DESIGN SPANNING ACROSS MULTIPLE DESIGN FABRICS", and U.S. patent application Ser. No. 14/504,408 filed concurrently and entitled "METHODS, SYSTEMS, AND ARTICLES OF MANUFACTURE FOR ANALYZING A MULTI-FABRIC ELECTRONIC DESIGN AND DISPLAYING ANALYSIS RESULTS FOR THE MULTI-FABRIC ELECTRONIC DESIGN SPANNING AND DISPLAYING SIMULATION RESULTS ACROSS MULTIPLE DESIGN FABRICS". The contents of the aforementioned U.S. provisional patent application and U.S. patent applications are hereby incorporated by reference in their respective entireties for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Customers may often desire to simulate an IC (integrated circuit) design within the context of a system design that spans across the IC design fabric, the package design fabric, and PCB (printed circuit board) design fabric. The schematics of PCB and Package may not always exist at the time of simulation. Even if the schematics of PCB and Package do exist at the time of simulation, these schematics may be available in different formats for different schematic tools. As a result, these schematics may be incompatible with each other and thus cannot be simulated together without translation, transformation, compilation, etc. (collectively transformation).

In addition, customers may desire to simulate this system design within the context of parasitics of the chip layout, the package layout, and the PCB layout. The parasitic-models may be extracted as combined geometries across multiple design fabrics. Some examples of such models may include on-chip spiral inductor extracted in conjunction with the package planes and traces. In some cases, complete PCB (or package) may be extracted as a single parasitic model that needs to connect to the remainder of the system. Nonetheless, it is very difficult to include parasitics from different design fabrics (e.g., different design fabrics in various layouts) in the simulation schematic.

Conventional approaches require manual creation of parasitic aware simulation schematics where a new schematic is manually created where PCB and package components are stitched into the IC schematic to create the simulation schematic. On the other hand, if PCB/package schematics available in their native schematic editors, user needs to copy the same schematics in the IC schematic entry tool. In some cases, if PCB/package schematics do not exist, user has to construct new schematic by going through respective layouts to obtain the connectivity.

In addition, parasitics of PCB and package traces and metal passive structures are manually stitched into the simulation schematic. Moreover, if parasitic models are extracted from portion of geometry that crosses multiple design fabrics, a user is required to keep a record of model interfaces to ensure that the model is properly connected and stitched into system schematic that spans across the IC design fabric, the PCB design fabric, and the package design fabric to maintain the entire design in single schematic entry tool for purposes of simulations.

Therefore, there exists a need for a method, system, and computer program product for provisioning measurements for constructing a simulation schematic of an electronic design across multiple design fabrics.

SUMMARY

Disclosed are method(s), system(s), and article(s) of manufacture for constructing a simulation schematic of an electronic design in various embodiments. Some first embodiments are directed at a method for constructing a simulation schematic of an electronic design.

In these first embodiments, a first extracted model may be identified from existing extracted models for a first circuit component design in a first layout in a first design fabric of an electronic design that spans across multiple design fabrics; a simulation schematic may be generated by inserting the first extracted model into the simulation schematic; and a simulation may be performed with the simulation schematic to generate a simulation result. In some of these embodiments, a second extracted model may be constructed for a second circuit component design that corresponds to no extracted models; and the simulation schematic may be updated by inserting the second extracted model into the simulation schematic.

In some of the immediately preceding embodiments, at least a portion of the first design fabric and a second design fabric of the multiple design fabrics may be cross probed to generate first connectivity information; and the first extracted model and the second extracted model may be interconnected based in part or in whole upon the first connectivity information. In some embodiments, the second circuit component design is situated in a second design fabric of the multiple design fabrics, and the first design fabric and the second design fabric include two of an integrated circuit (IC) design fabric, an IC package design fabric, and a printed circuit board (PCB) design fabric.

In addition or in the alternative, a schematic cellview symbol may be identified for the second circuit component design from a schematic cellview symbol data structure stored in a non-transitory computer accessible storage medium; and third connectivity information for the second circuit component design may be extracted. In some of these immediately preceding embodiments, parasitic information for the second circuit component design may be extracted; and the second extracted model may be constructed by associating at least the third connectivity information and the parasitic information with the schematic cellview symbol.

In some of the first embodiments, one or more schematic models may be identified for one or more third circuit component designs in one or more layouts in the multiple design fabrics; and second connectivity information may be extracted for the one or more third circuit component designs. In some of these embodiments, the simulation schematic may be updated by inserting the one or more schematic models into the simulation schematic; and the first extracted model may be interconnected to at least one schematic model of the one or more schematic models based in part or in whole upon the second connectivity.

In some of the first embodiments, a first request for identifying a first circuit component design in the simulation schematic may be received; a first corresponding circuit component design may be automatically identified in a master schematic design; and the first corresponding circuit component design may be presented with a first textual or graphical emphasis in the master schematic design.

In some of the first embodiments, a second request for identifying a parasitic model in the simulation schematic may be received; a second circuit component design in the master schematic design or a master layout may be automatically identified for the request, wherein the second circuit component design corresponds to the parasitic model that has been identified; and the second corresponding circuit component design may be presented with a second textual or graphical emphasis in the master schematic design or the master layout.

In some of the first embodiments, a layout versus schematic check may be performed with at least the first layout and the simulation schematic. In addition or in the alternative, a first schematic design in one design fabric of the multiple design fabrics may be identified; and a schematic versus schematic check may be performed with at least the first schematic design and the simulation schematic.

Some embodiments are directed at one or more hardware mechanisms that include and/or function in conjunction with at least one micro-processor as well as other related components or architectures of one or more computing systems and may be invoked to perform any of the methods, processes, or sub-processes disclosed herein. The hardware system may include one or more variants of a design implementation mechanism, a multi-fabric probing mechanism, a multi-fabric netlisting mechanism, a multi-fabric analysis mechanism, a multi-fabric checking and/or verification mechanism, and/or a multi-fabric view correlation mechanism in some embodiments.

Each of these mechanisms may include or function in tandem with electrical circuitry and one or more microprocessors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A mechanism may be initialized in a computing system so that the software portion of the mechanism is stored in memory (e.g., random access memory) to be executed by one or more processors or processor cores off the computing system to perform at least a part of the functionality of the mechanism. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for verifying connectivity of an electronic design are described below with reference to FIGS. 1-5.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 4H-L illustrate some examples of extraction of circuit elements and representation of circuit elements in one or more extracted models in one or more embodiments.

DETAILED DESCRIPTION

Figure 1A:
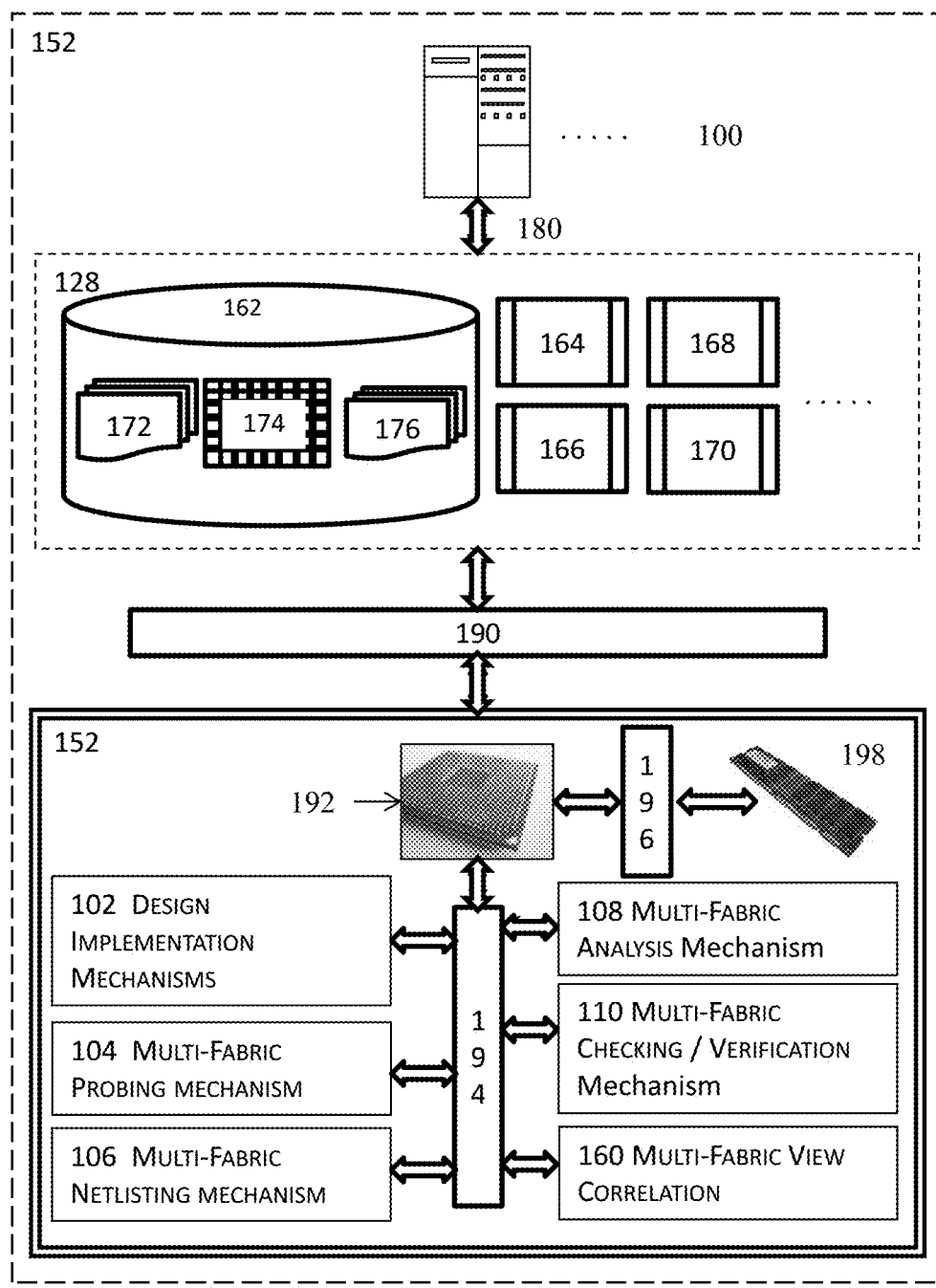
FIG. 1A illustrates a high level schematic block diagrams for constructing a simulation schematic of an electronic design across multiple design fabrics in one or more embodiments.

Various embodiments are directed to a method, system, and computer program product for verifying connectivity of an electronic design. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-5.

Some embodiments described herein are directed at an apparatus and method that automatically read an electronic design (e.g., a schematic or layout of a system design) and automatically generate a simulation schematic. Some other embodiments described herein are directed at an apparatus and method that identify extracted models of one or more portions of an electronic design and automatically insert these extracted models as schematic components in the simulation schematic and replace the design components that are part of the extracted models with the extracted models.

One of the advantages of these techniques described herein is the that the designers no longer need to reconstruct the PCB and package design schematics around the IC chip design, and these techniques thus provide a net saving in time and effort. Another advantage is that connectivity information may be automatically extracted from various schematics and/or layouts without or with little human intervention even in the absence of the PCB schematic or the IC package design schematic. Some other embodiments are directed at an apparatus and a method that construct a parasitic aware simulation schematic from layouts across design fabrics (e.g., IC design fabric, IC package design fabric, PCB design fabric, etc.)

Another advantage of some techniques described herein is that the parasitic models extracted from various layouts may be automatically inserted in a simulation schematic without or with little human intervention. Another advantage is that a designer no longer needs to keep track of design components that have been included in a parasitic model and thus needs to be removed from the system schematic. Another advantage is that when one logical interface is distributed over multiple pins (e.g., an interface having five pins that are connected to $V_{DD}$), the interconnection between the logical interface and the multiple pins may be automatically furnished.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1A illustrates a high level schematic block diagrams for constructing a simulation schematic of an electronic design across multiple design fabrics in one or more embodiments. More specifically, FIG. 1A illustrates an illustrative high level schematic block diagrams for constructing a simulation schematic of an electronic design across multiple design fabrics and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms 152 including hardware mechanisms and software modules or combinations of one or more hardware mechanisms and one or more software modules that may comprises a plurality of design implementation modules 102 (e.g., schematic design tool, layout tool, etc.) to insert, remove, modify, improve, optimize, or otherwise operate upon designs in different fabrics (e.g., the die design fabric, the integrated circuit or IC packaging design fabric, the printed circuit board or PCB design fabric, the test bench design fabric, etc.), one or more multi-fabric probing modules 104 to probe multi-fabric designs across multiple design fabrics.

The set of mechanisms 152 may further optionally include one or more multi-fabric netlisting modules 106 to netlist multi-fabric designs across multiple design fabrics, one or more multi-fabric analysis modules 108 to simulate or analyze multi-fabric design across multiple design fabrics, one or more check or verification modules 110 to check or verify the correctness of multi-fabric designs across multiple design fabrics, and one or more multi-fabric view correlation modules 160 to correlate various symbolic views, schematic views, and/or layout views with the schematic design data or the layout data in different design fabrics at various hierarchical levels, etc.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 1B:
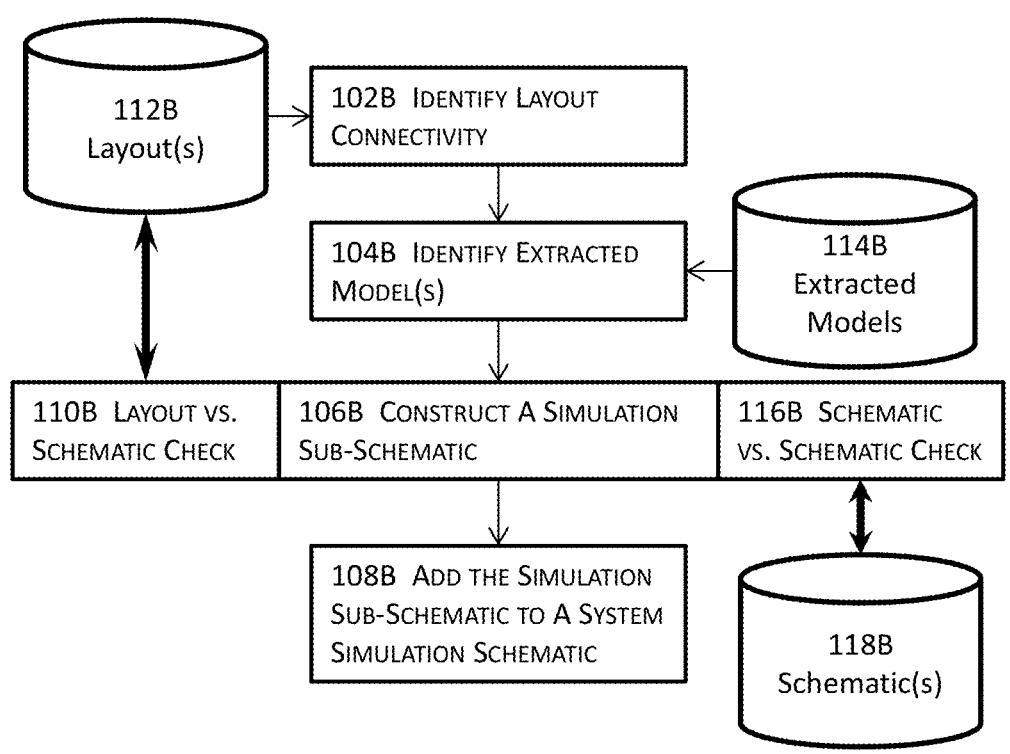
FIG. 1B illustrates another high level schematic block diagrams for constructing a simulation schematic of an electronic design across multiple design fabrics in one or more embodiments.

FIG. 1B illustrates another high level schematic block diagrams for constructing a simulation schematic of an electronic design across multiple design fabrics in one or more embodiments. In these embodiments, one or more layouts 112B may be identified from one or more non-transitory computer readable storage media or devices. These one or more layouts may include one or more integrated circuit (IC) layouts, one or more IC package layouts for the one or more IC layouts, and/or a printed circuit board (PCB) layout, etc.

Layout connectivity may be identified or extracted at 102B from these one or more layouts 112B, and the extracted layout connectivity may be used to interconnect various models in the simulation schematic. One or more extracted models may be identified at 104B from a list of extracted models 114B obtained from the same electronic design or one or more prior electronic designs.

It shall be noted that various schematics may or may not necessarily exist in these one or more embodiments illustrated in FIG. 1B. Existing schematic symbols or models may be leveraged such that extracted models need not be constructed every time they are needed in a simulation schematic. A schematic cellview symbol or model may be used directly as an extracted model in a simulation schematic in some embodiments or may be annotated, stitched, or associated with parasitic data to form an extracted model in some other embodiments.

In some embodiments where one or more schematic designs (e.g., the schematic of a PCB design, the schematic of an IC package, the schematic of an IC design, etc.) do exist, the schematic models or cellview symbols for circuit component designs in a plurality of design fabrics may thus be extracted from the respective schematic designs and imported as the extracted models into the simulation schematic. In some embodiments, a schematic cellview symbol or model may further be annotated or stitched with parasitic data and stored as an extracted model in a central repository.

These one or more schematic designs may or may not necessarily be in a format that is compatible or recognizable by the native editor of a simulation schematic. Schematic cellview symbols or models from these one or more schematic designs may be imported as extracted models into a simulation schematic via transformation in some embodiments or may be constructed anew and stored in a central repository in some other embodiments.

In some other embodiments where the schematic designs are unavailable or incomplete such that some circuit component designs extracted from one or more layouts (e.g., an IC layout, an IC package layout, a PCB layout, etc.) do not correspond to any existing schematic models or cellview symbols that may be used in simulation schematics, the extracted models for these layout circuit component designs may be constructed anew.

An extracted model includes a simplified model to represent one or more layout circuit component designs in a simulation schematic in some embodiments. In some of these embodiments, an extracted model is placeable in a simulation schematic and includes model connectivity information (e.g., net names, port names, pin names, etc.) that may be used to interconnect the extracted model to one or more other models or external circuitry in the simulation schematic. For example, extracted models may be interconnected by straight or rectilinear flight-lines in some embodiments.

An extracted model may be constructed anew for a layout circuit component (e.g., an instance of a cell or block) and include a flat or a hierarchical structure of multiple hierarchies or a plurality of circuit components. For example, it may be determined that a circuit component design extracted from a layout does not correspond to any existing extracted models.

In some embodiments, an extracted model may be constructed by using a corresponding schematic cellview symbol or model from the schematic design (if available) or from a schematic cellview symbol data structure. For example, various techniques may first examine a schematic symbol cellview data structure (e.g., a list, a table, a database, etc.) to determine whether a schematic cellview symbol exists for the circuit component design. If an existing schematic cellview symbol exists for the circuit component design based on, for example, the type, identification, function, and/or connectivity, etc. of the circuit component design, the schematic cellview symbol may be retrieved from the schematic cellview symbol data structure to represent the layout circuit component.

The schematic cellview symbol may be further associated with other data (e.g., the identifications of ports for interconnection, the identifications of the layer, the instance, the hierarchy, etc.) specific to this particular circuit component to represent this particular circuit component in simulation schematics. In some other embodiments where no schematic cellview symbols or models correspond to the circuit component design extracted from the layout, a new schematic cell view symbol may be constructed anew with a native schematic editor that is capable of natively editing the simulation schematics in one or more design fabrics.

In some of these embodiments, an extracted model may include a geometric entity (e.g., a rectangle) that has any shape or size and is placeable in a simulation schematic or in the schematic design corresponding to the layout from which the circuit design component is extracted. In some other embodiments, an extracted model may include a geometric entity (e.g., a rectangle) that exactly, approximately, or proportionally represents the actual geometries of the circuit component (or circuit components).

These existing and newly constructed extracted models may thus be used to construct a simulation schematic at 106B for the electronic design that spans across multiple design fabrics. One or more layout versus schematic checks may be performed at 110B on the layouts 112B and the simulation schematic determined at 108B to determine whether the simulation schematic determined at 108B correctly corresponds to the layouts of the electronic design in these multiple design fabrics. In some embodiments where at least some schematic designs 118B are available, one or more schematic versus schematic checks may also be performed at 118B on these at least some schematics and the simulation schematic to determine whether the constructed simulation schematic correctly corresponds to these at least some schematics 118B.

The simulation schematic may be incrementally constructed and added as a simulation sub-schematic to a system simulation schematic at 108B. For example, an IC layout may be identified; circuit design components may be extracted from the identified IC layout; extracted models may be identified or constructed anew for these IC layout circuit design components; the simulation sub-schematic for the IC layout may be constructed with these extracted models; and the simulation sub-schematic may be incrementally constructed into a system simulation schematic (e.g., a system simulation schematic for a PCB design including the IC design).

Figure 1C:
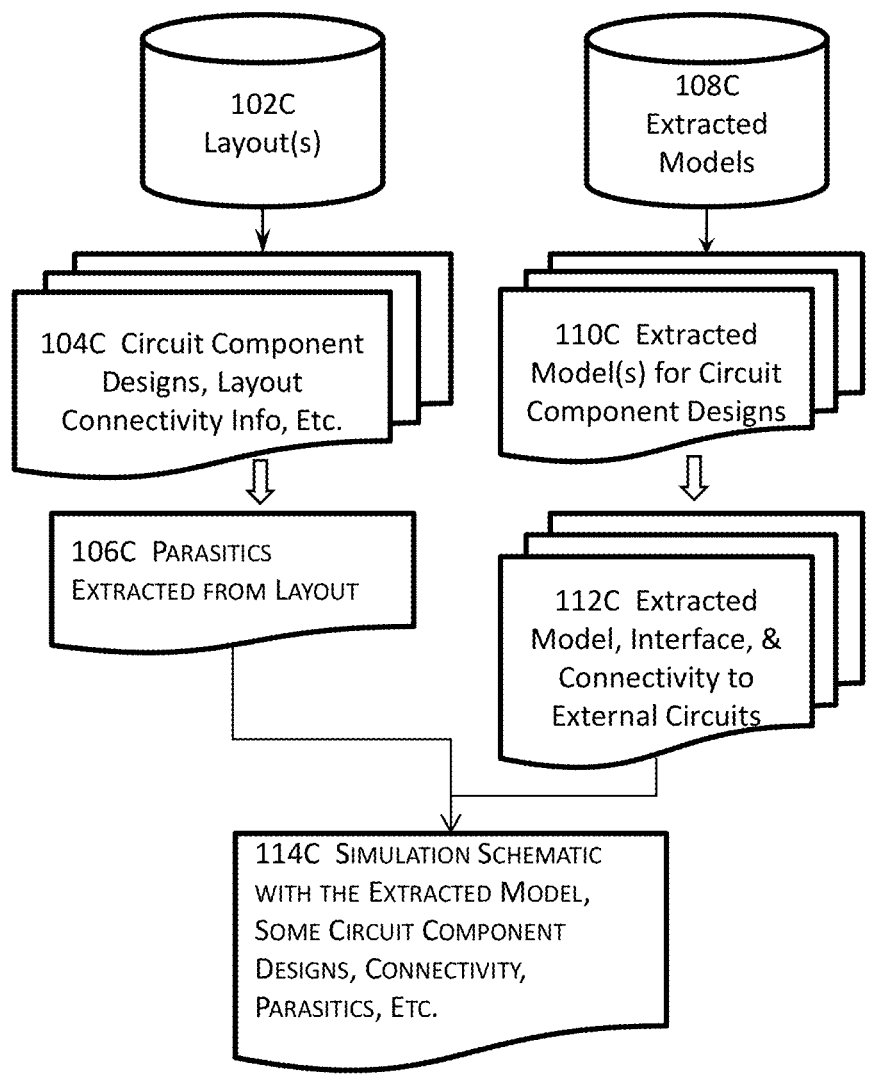
FIG. 1C illustrates another high level schematic block diagrams for constructing a simulation schematic of an electronic design across multiple design fabrics in one or more embodiments.

FIG. 1C illustrates another high level schematic block diagrams for constructing a simulation schematic of an electronic design across multiple design fabrics in one or more embodiments. In these embodiments, one or more layouts (e.g., one or more IC layouts, one or more IC package layouts corresponding to the one or more IC layouts, a PCB layout, etc.) may be identified from a non-transitory computer accessible store medium or device 102C; and existing extracted models corresponding to respective layout circuit components may be retrieved from an extracted model data structure 108C in the same or a different non-transitory computer accessible store medium or device. Circuit component designs and layout connectivity information for interconnecting among these circuit component designs and external circuitry 104C may be extracted from the one or more layouts 102C. Parasitic data 106C may also be extracted from these one or more layouts 102C.

If extracted models 108C exist for at least some circuit component designs in the one or more layout 102C, these extracted models 110C may be retrieved from the extracted model data structure 108C. These existing extracted models, their respective interface information (e.g., the names of the ports, the names of nets connected to the interface, etc.), and/or connectivity information to external circuitry of an extracted model 112C may be identified. In some embodiments, these extracted models themselves may already include or be associated with parasitics and connectivity information.

These existing extracted models for some layout circuit component designs together with newly constructed extracted models for other layout circuit component designs for which no extracted models exist may be placed into a simulation schematic 114C. For example, a layout may include circuit component designs L1, C1, R2, Q4, U1, U2, and L7, where existing extracted models are determined to be available for layout circuit component designs C1, R2, and L7. In this example, the simulation schematic for this layout may include the existing extracted models for C1, R2, and L7 as well as newly constructed extracted models for L1, Q4, U1, and U2.

Figure 1D:
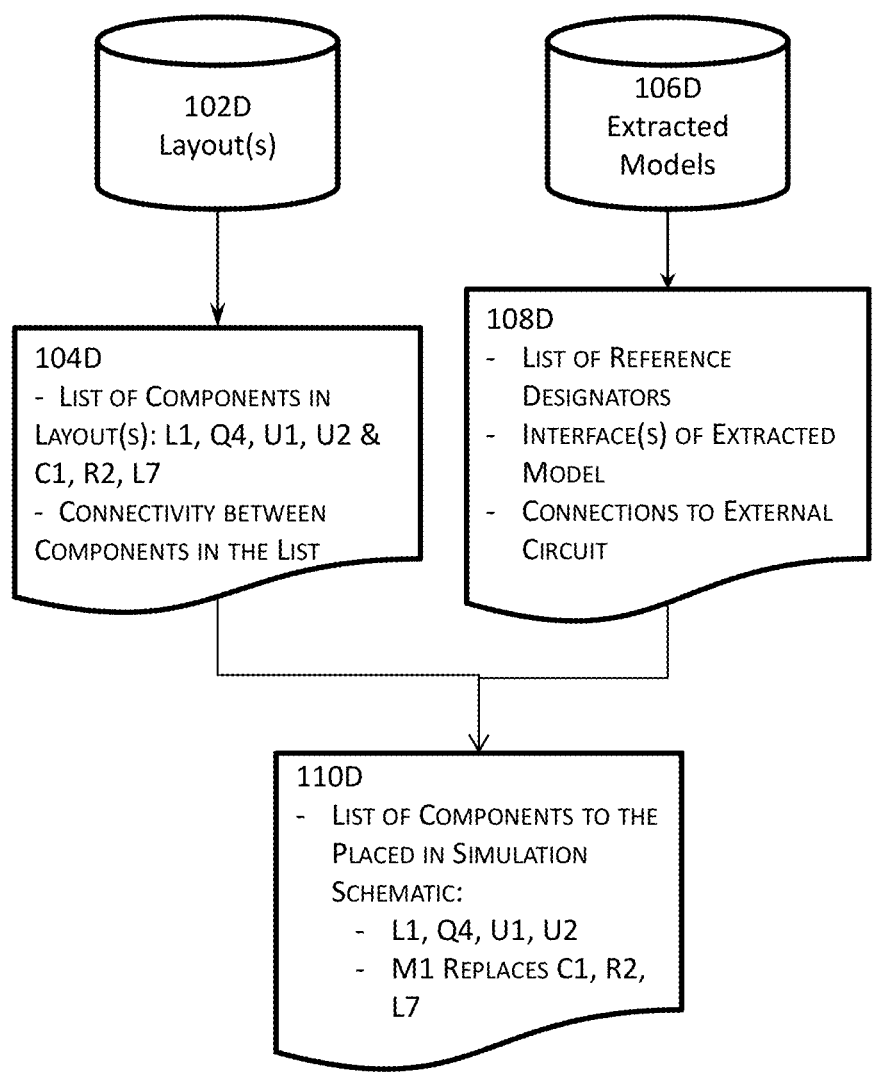
FIG. 1D illustrates an example of determining a list of circuit component designs to place in a simulation schematic in one or more embodiments.

This example is further illustrated in FIG. 1D which illustrates an example of determining a list of circuit component designs to place in a simulation schematic in one or more embodiments. From the layout 102D, a list of circuit component designs 104D in the layout (e.g., L1, Q4, U1, U2, C1, R2, and L7) may be obtained from the layout 102D. In addition, the connectivity between these circuit component designs in the list may also be determined and added to 104D. As described above, an extracted model M1 already exists for the circuit component designs C1, R2, and L7 and may be retrieved from a data structure or database 106D including extracted models. A list of reference designators and the interfaces for the extracted models (e.g., M1) may also be retrieved from the data structure or database 106D. The connectivity information of an extracted model (e.g., M1) may also be retrieved from the data structure or database 106D of extracted models. With the list of components and the connectivity from 104D and the list of reference designators and the interface and connectivity for the extracted model (M1), a list of components or models to be placed in the corresponding simulation schematic 110D may be determined. In this example, the simulation schematic 110D may include the circuit component designs or the schematic symbols or models thereof for L1, Q4, U1, and U2 that do not correspond to any extracted models. The simulation schematic may further include the extracted model M1 that is to replace the circuit component designs (or the schematic symbols or models thereof) for circuit component designs C1, R2, and L7. In some embodiments, an extract model (e.g., M1 in this example illustrated in FIG. 1D) may include, for example, an s-parameter (scattering-parameter) model.

In some embodiments where individual extracted models may not be available or exist, but an aggregated extracted model may nevertheless exist for a plurality of interconnected circuit component designs. In these embodiments, the aggregated extracted model may be identified and used to represent the plurality of interconnected circuit component designs in simulation schematics. In the aforementioned example where no extracted models exist for layout circuit components L1, Q4, U1, and U2, but an aggregated extracted model nevertheless exists and includes these layout circuit components L1, Q4, U1, and U2.

In this example, the aggregated extracted model together with the data of its interface to external circuits, rather than individual extracted models for L1, Q4, U1, and U2, may be used in a simulation schematic in some embodiments. In some embodiments, all the circuit component designs may be first added to a placement list. For a circuit component that corresponds to an existing extracted model, the existing extracted model may be placed in the simulation schematic. For another circuit component design for which no existing extracted models exist, a new extracted model may be constructed and placed into the simulation schematic.

Figure 2A:
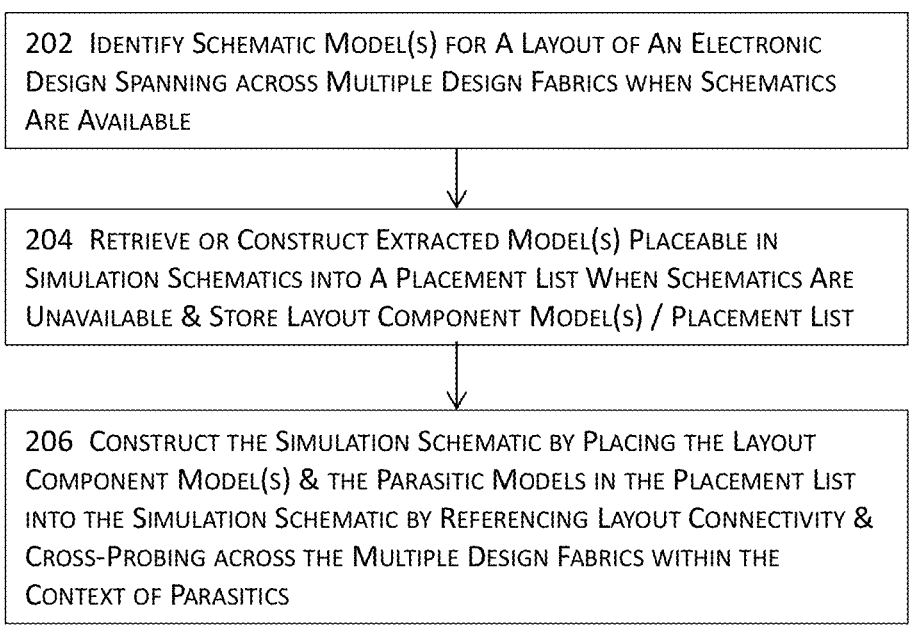
FIG. 2A illustrates a high-level block diagram for constructing a simulation schematic of an electronic design across multiple design fabrics in one or more embodiments.

FIG. 2A illustrates a high-level block diagram for constructing a simulation schematic of an electronic design across multiple design fabrics in one or more embodiments. In these one or more embodiments, one or more schematic models may be identified at 202 for a layout of an electronic design that spans across multiple design fabrics when these one or more schematic models are available.

It shall be noted that various techniques described herein do not require schematic designs to perform their intended functions to achieve their intended purposes although elements (e.g., schematic model or cellview symbols, connectivity, etc.) of schematic designs, regardless of whether these schematic designs are complete or partial, may nevertheless be used to reduce the computational resources and/or time needed to constructed a simulation schematic for an electronic design across multiple design fabrics in some embodiments.

A schematic model may include a schematic symbol and connectivity information for interconnecting the schematic symbol to external circuitry. The identified schematic models may be stored in a data structure such as a list, a table, a database, etc. For the ease of explanation or description, the data structure includes and will be referred to as a placement list although other types of data structures may also be used.

Schematic models, like schematic designs, may have the same format or different formats. For example, a PCB schematic design or a schematic model therein may have a different format than an IC schematic design or a schematic model therein. In some embodiments, schematic models in different formats may be transformed into a format that is recognized by a native schematic editing tool in one of the multiple design fabrics. For example, PCB schematic models in a first format and IC package schematic models in a second format may be transformed into another format recognizable by an IC schematic editor. In some other embodiments, a new schematic model may be constructed for a schematic model in a different format.

At 204, extracted models may be retrieved from existing sources or constructed anew for layout circuit designs in the layout. An extracted model includes a simplified model having a geometric entity to represent one or more layout circuit component designs in a simulation schematic in some embodiments. In some of these embodiments, an extracted model is placeable in a simulation schematic and includes model connectivity information (e.g., net names, port names, pin names, etc.) that may be used to interconnect the extracted model to one or more other models or external circuitry in the simulation schematic. These extracted models may also be stored in a data structure such as the aforementioned placement list.

At 206, a simulation schematic may be constructed by placing the extracted models into the simulation schematic and further by interconnecting the extracted models with connectivity information extracted from the layout. In some embodiments where schematic cellview symbols or models are also identified for one or more layout circuit components that correspond to no extracted models or aggregated models, the schematic cellview symbols or models may also be placed in the simulation schematic. In addition or in the alternative, parasitic data extracted from the layout may also be stitched into or associated with the corresponding schematic cellview symbols or models or may be placed into the simulation schematic if these schematic cellview symbols or models are also placeable.

Figure 2B:
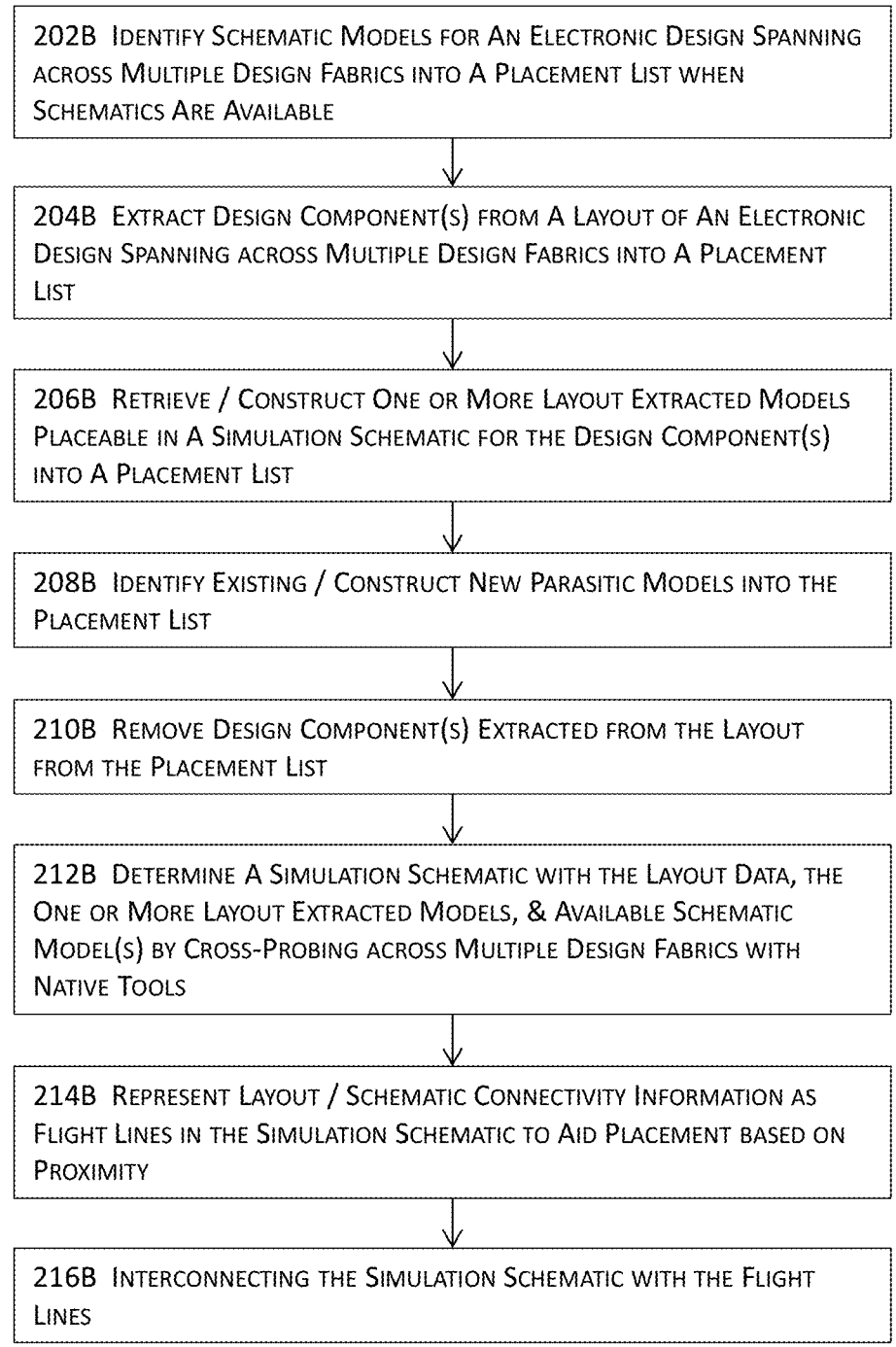
FIG. 2B illustrates a more detailed block diagram for constructing a simulation schematic of an electronic design across multiple design fabrics in one or more embodiments.

FIG. 2B illustrates a more detailed block diagram for constructing a simulation schematic of an electronic design across multiple design fabrics in one or more embodiments. In these embodiments illustrated in FIG. 2B, available schematic models corresponding to layout circuit components may be identified at 202B for an electronic design that spans across multiple design fabrics. In some embodiments, the electronic design includes at least one PCB design having one or more IC package designs interconnected together and encompassing the one or more corresponding IC designs.

A schematic model may include an object that includes a schematic symbol, some connectivity information for interconnecting the schematic model to external circuitry, and parasitic information in some embodiments. In some other embodiments, a schematic model may include a schematic cellview symbol or model that is retrieved from a schematic cellview data structure storing therein a plurality of schematic cellview symbols each having one or more parameters awaiting their corresponding one or more values to determine the characteristics or attributes of a specific circuit component that is represented by the schematic cellview symbol or model in a schematic design.

In these embodiments, the schematic cellview symbol or model for a particular layout circuit component may be elaborated by identifying the one or more corresponding parameter values such as names or identifications of the schematic circuit component design represented by the symbol, nets, ports, pins, layer(s), instance(s), etc., interface or interfaces, connectivity information for interconnecting the interface or interfaces to external circuits, or any other information suitable for creating a schematic cellview symbol or model to uniquely represent one or more such schematic circuit component designs in a schematic design.

The schematic editing mechanism that natively manipulates extracted models may invoke various drawing capabilities of the schematic editing mechanism or one or more other mechanisms in one design fabric (e.g., a layout editing mechanism in an IC design fabric) and function in tandem with editing mechanisms that natively manipulate data in one or more other design fabrics to cross probe circuit component designs in one or more schematics and/or layouts across multiple design fabrics to automatically identify the one or more parameter values to create a unique schematic model and associate information such as the parasitic information and/or some connectivity information to generate an extracted model from the unique schematic model for a layout circuit component design that corresponds to no existing extracted models.

As described above, schematics may or may not necessarily be available or complete for some or all of the designs in the multiple design fabric electronic design. The identification of schematic cellview symbols or models when some schematics are available may reduce the computational resources and runtime in generating a simulation schematic.

At 204B, layout circuit component designs may be extracted from one or more layouts of the electronic design spanning across multiple design fabrics. In some embodiments, these layout circuit components or information therefor (e.g., identifications of layout circuit component designs with pointers, link structures, or symbolic links to these layout circuit component designs) may be stored in a data structure such as a list, a table, a database, etc. such as a placement list.

One or more layout extracted models corresponding to the one or more identified layout circuit component designs may be retrieved or extracted from a non-transitory computer accessible storage medium or device at 206B. In some embodiments where no extracted models are available for certain layout circuit component designs, additional extracted models may be constructed anew for these certain layout circuit component designs at 206B. An extracted model includes a simplified model to represent one or more layout circuit component designs in a simulation schematic in some embodiments.

In some of these embodiments, an extracted model is placeable in a simulation schematic and includes model connectivity information (e.g., net names, port names, pin names, etc.) that may be used to interconnect the extracted model to one or more other models or external circuitry in the simulation schematic. In addition or in the alternative, an extracted model may further include parasitic information that is stitched into or associated with the elements (e.g., circuit components, traces, wires, interconnects, etc.), parasitic models encompassing the parasitic information, or a combination thereof.

At 208B, existing parasitic models indicative of parasitic information or data of one or more layout circuit components may be identified. A parasitic model may include an s-parameter or SPICE model that represents the R/L/C parasitics of the traces, interconnects, and/or metal structures in an electronic design. In some embodiments where parasitic models are unavailable for certain layout circuit component designs, new parasitic models may be constructed by extracting the corresponding parasitic information or data for these layout circuit component designs from the layout.

The existing and newly constructed parasitic models at 208B and/or the extracted models at 206B or information therefor may be added to the data structure identified at 202B. In some embodiments where extracted models or schematic cellview models together with the corresponding parasitic information or parasitic models are identified or constructed for any layout circuit component designs in the data structure, these layout circuit component designs or information therefor in the data structure may be removed from the data structure at 210B because of the placeability and the completeness of information of these extracted models and the schematic cellview symbols or models plus the corresponding parasitic information.

At 212B, a simulation schematic may be determined with data or information associated with the one or more layouts, the one or more extracted models, one or more available schematic cellview symbols or models by cross probing within the same design fabric and/or across multiple design fabrics. The data or information associated with the one or more layouts may include, for example, connectivity extracted from the one or more layouts. Cross probing across multiple design fabrics comprises the determination of which net segments in which specific design fabric are part of or connecting to a specific net in another design fabric in some embodiments.

In some of these embodiments, probing may determine a list of net segment for the entire net from its source to its destination across multiple design fabrics. In addition or in the alternative, probing may also determine data or information associated with a particular net or various nodes along the particular net. For example, probing may identify or determine various electrical data (e.g., nodal voltages, currents, current densities, electromigration data, etc.) or physical or electrical parasitics (e.g., dimensional data, temperatures, resistances, capacitances, inductances, etc.) at various nodes or portions of a net.

Probing results may be textually and/or graphically emphasized in a user interface. As another example, a net connecting a first pin at the top level of a test bench through a first net to a first IC package in a PCB, a second net from the first IC package to a die, and a third net within the die may be identified with the same textual or graphical emphasis or annotations (e.g., with the same line type, line size, color, or other annotations) through probing. More details about cross probing are described in the Section entitled Cross Reference to Related Patent Applications.

Connectivity data or information extracted from the one or more layout may be represented as flight-lines to interconnect the extracted models, the parasitic models, and/or the available schematic cellview symbols or models, etc. in the simulation schematic at 214B to aid placement or insertion of these models into the simulation schematic. In some embodiments, placing or inserting a model in a simulation schematic may be based in part or in whole upon proximity between two or more models or proximity between one or more models and one or more flight-lines or one or more segments thereof as indicated by the connectivity information or data.

A flight-line may include a straight line segment between its source and destination in some embodiments or a set of rectilinear line segments between the source and the destination of the flight-line in some other embodiments. It shall be noted that unlike placement of layout shapes in a layout, placement or insertion of models in a simulation schematic does not necessarily produce geometrically or topologically accurate results because the simulation schematic symbolically or generally but does not geometrically represent how models are connected with flight-lines. In some embodiments where a flight-line includes a set of connected rectilinear line segments, these connected rectilinear line segments may or may not topologically or geometrically represent how the wires or traces will be implemented. The interconnection of various elements in the simulation schematic may be completed by using the flight-lines at 216B.

Figure 2C:
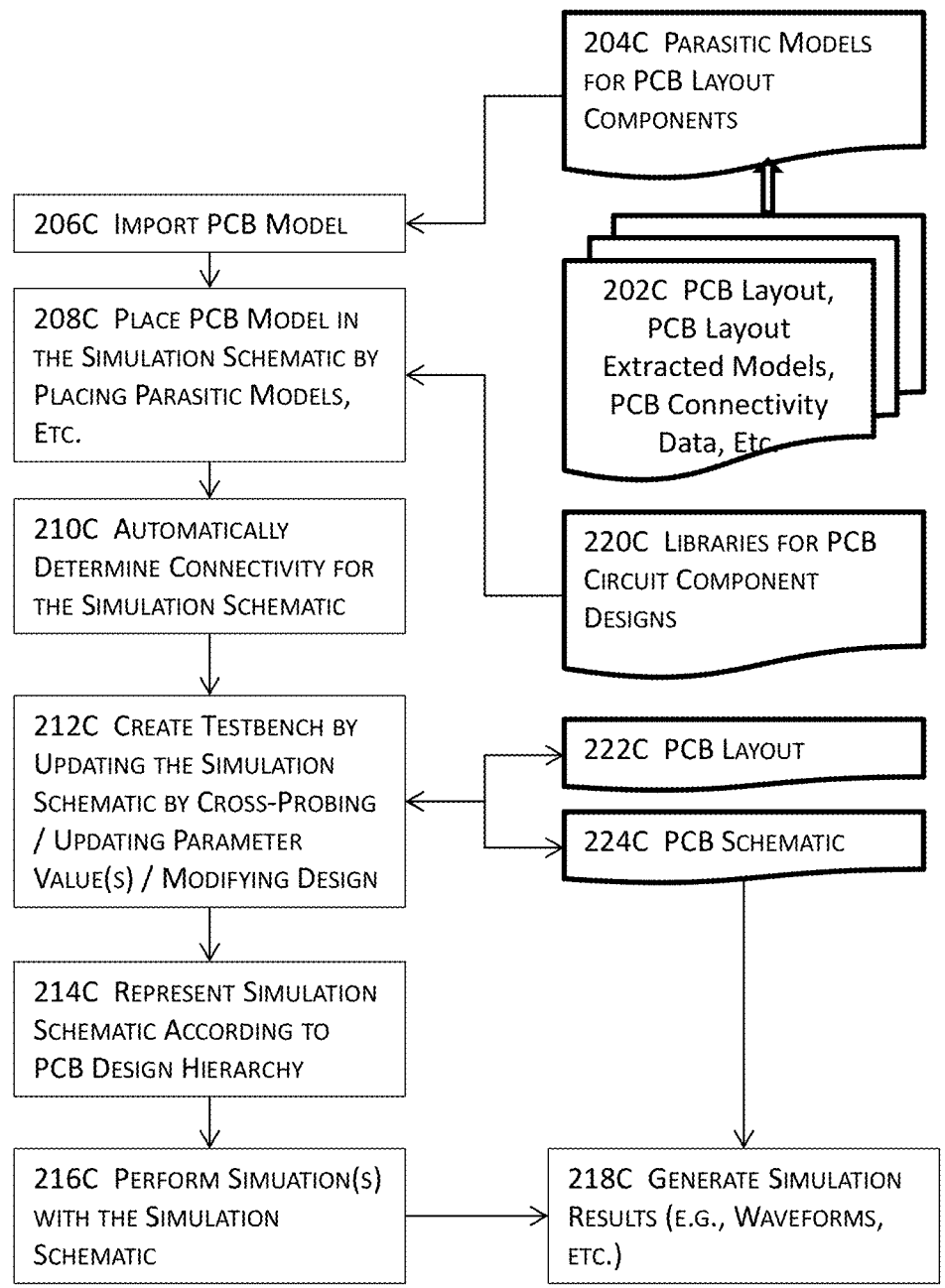
FIG. 2C illustrates another more detailed block diagram for constructing a simulation schematic of an electronic design across multiple design fabrics in one or more embodiments.

FIG. 2C illustrates another more detailed block diagram for constructing a simulation schematic of an electronic design across multiple design fabrics in one or more embodiments. In these embodiments, a PCB layout and one or more pieces of information 202C may be identified. These one or more pieces of information may include, for example, one or more extracted models for components in the PCB layout, connectivity data extracted from the PCB layout, or any other required or desired data or information for constructing a simulation schematic including a schematic representation of the PCB layout in some embodiments.

An extracted model may include parasitic data or information in some embodiments or no parasitic data or information in some other embodiments. An extracted model may include names, numbers, and/or identifications of pins, ports, pads, nets, or net segments, etc. Parasitic models 204C may also be determined or identified for extracted models (when extracted models do not include parasitic information) and one or more PCB layout component designs that do not correspond to any extracted models regardless of whether or not extracted models include parasitic information.

The PCB model may be imported at 206C into a simulation schematic at 208C by placing the parasitic models, the extracted models, etc. with the connectivity data extracted from the PCB layout. One or more libraries for PCB circuit component designs 202C may also be provided to aid placing or inserting the PCB model in the simulation schematic in some embodiments. In some embodiments where the PCB model, the PCB extracted models, or the PCB parasitic models are in one or more formats that are not native to an editing mechanism of the simulation schematic, the importation of the PCB model into the simulation schematic may include transformation, mapping, translation, or reconstruction, etc. of these models in one or more models in one or more non-native formats into one or more formats that are native to the simulation schematic editing mechanism.

Connectivity may be automatically determined at 210C for the simulation schematic and various sub-models (e.g., IC package models, models for discrete components, etc.) from the PCB layout by cross probing. For example, cross probing may use respective native tools to establish the connectivity for a net interconnecting a discrete component and an IC package model and associate the flight-line in the simulation schematic, the model for the discrete component or an interface thereof, and the model for the IC package design or an interface thereof with the corresponding connectivity information.

Connectivity may include, for example, how various circuit component designs in the PCB layout are connected, the terminal order and/or identifications of an interface of a circuit component design, and/or a mapping to a split symbol instances or nets, etc. in some embodiments. A testbench may be created at 212C by updating the simulation schematic via cross-probing, updating parameter values, and/or modifying the underlying electronic design in some embodiments.

A layout versus schematic check may be performed on the testbench created at 212C by referencing the PCB layout 222C in some embodiments to cross check the correctness of the testbench, the simulation schematic, and/or the PCB layout. In some embodiments where the PCB schematic is available, a schematic versus schematic check may also be performed on the simulation schematic or the testbench by referencing the PCB schematic 224C to cross check the correctness of the testbench, the simulation schematic, and/or the PCB schematic.

The testbench may be represented in a hierarchical structure at 214C according to the hierarchical structure of the PCB design in some embodiments or in a flat structure having only one hierarchical level in some other embodiments. Simulations may be performed at 216C with the simulation schematic to generate simulation results including, for example, waveforms of signals, etc. at 218C. In some embodiments where the PCB schematic is available, the PCB schematic 224C may also be associated with the simulation results generated at 218C.

Figure 3A:
FIG. 3A illustrates a block diagram for cross probing a simulation schematic across multiple design fabrics in one or more embodiments.

FIG. 3A illustrates a block diagram for cross probing a simulation schematic across multiple design fabrics in one or more embodiments. In these embodiments, design components in the simulation schematic (e.g., the simulation schematic constructed at 206) may be cross-probed at 302 by using one or more native schematic editors, one or more layout editors, or any combinations thereof, without using any translators, compilers, or specifically designed editors or parsers. Design data are native to a tool or mechanism if the tool or mechanism may be used to generate, access, modify, and/or maintain the design data without performing any transformation, mapping, export, or abstraction on the design data in some embodiments.

In some of these embodiments, only design data that are native to a tool or mechanism are visible to and accessible by the tool or mechanism. On the other hand, design data are non-native to a tool or mechanism if the tool or mechanism cannot access the design data without performing some transformation, exportation, or mapping on the design data. In some of these embodiments, design data that are non-native to a tool or mechanism are invisible to and hence inaccessible by the tool or mechanism. At 304, a request for identifying a design component in the simulation schematic may be received at an EDA (electronic design automation) tool. For example, a pin in an electronic design (e.g., a schematic or a layout) may be identified by clicking on the pin in a design window showing a portion of an electronic design at 304.

At 306, one or more corresponding design components that correspond to or are associated with the identified design component may be automatically identified in one or more schematics (e.g., an IC schematic, an IC package schematic, a PCB schematic, etc.) in the corresponding native schematic editor(s) and/or one or more layouts (e.g., an IC layout, an IC package layout, a PCB layout, etc.) in the corresponding native layout editor(s). At 308, the one or more identified corresponding design components may be presented in the native schematic editor(s), the native layout editor(s), or any combinations thereof. The one or more identified corresponding design components may be automatically emphasized by using textual emphasis, graphical emphasis, or a combination thereof at 310.

In addition or in the alternative, a request for identifying a parasitic model in the simulation schematic may be received at 312. For example, a designer may identify a particular parasitic model in the simulation schematic by clicking on the particular parasitic model in a design window showing a portion of an electronic design at 312. At 314, one or more corresponding design components or one or more nets corresponding to or associated with the identified parasitic model may be automatically identified in the design schematic(s) (e.g., an IC schematic, an IC package schematic, a PCB schematic, etc.) and/or one or more layouts (e.g., an IC layout, an IC package layout, a PCB layout, etc.).

At 316, the one or more identified corresponding design components or one or more nets may be presented in the user interface(s) of their respective native schematic editor(s) or respective layout editor(s) in response to the request for identifying a parasitic model received at 312. At 318, the simulation schematic may be optionally verified against the design schematic(s) and/or the design layout(s) in some embodiments.

Figure 3B:
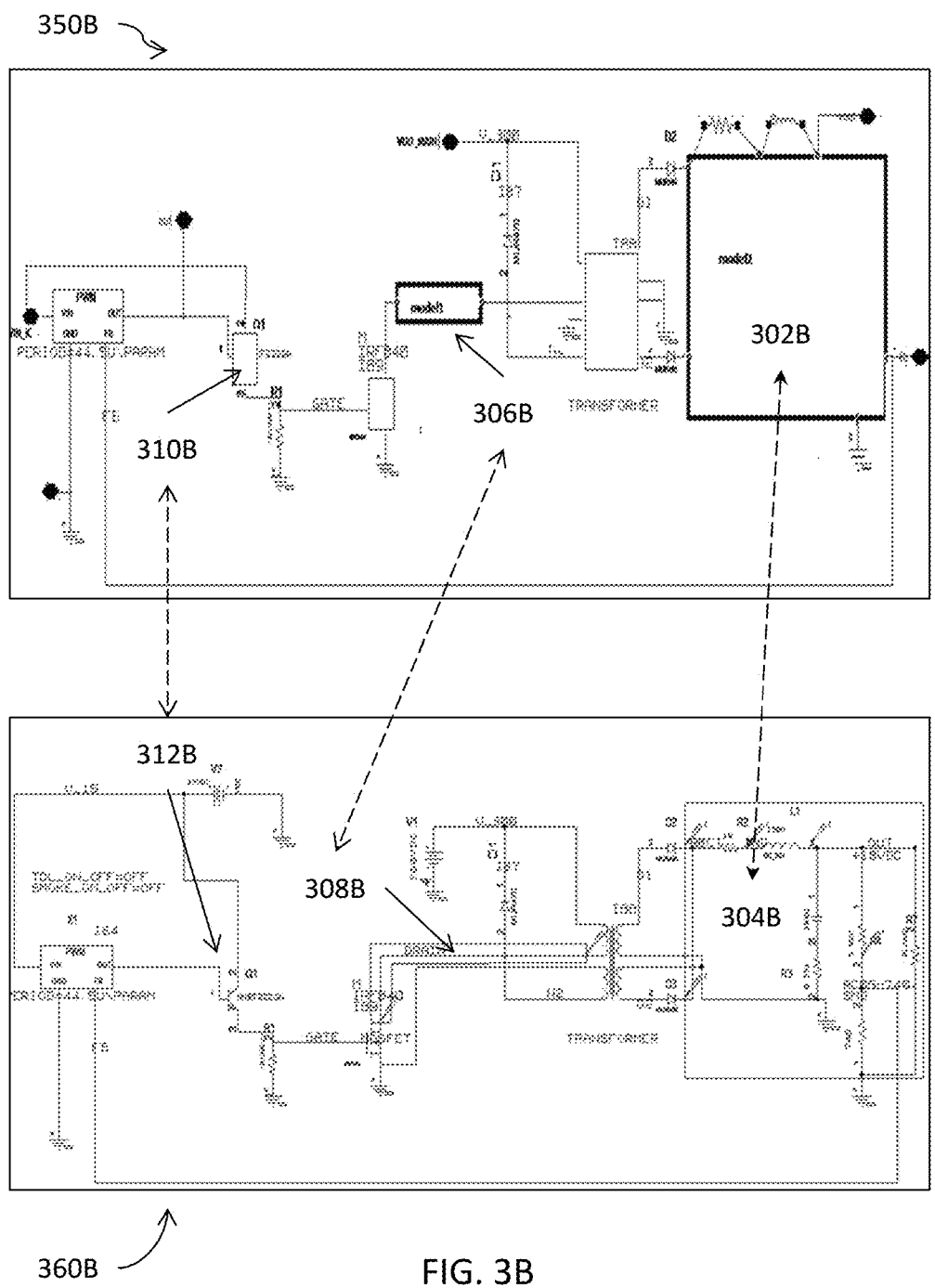
FIG. 3B illustrates some examples of cross probing a simulation schematic with respect to a master schematic in one design fabric of multiple design fabrics in one or more embodiments.

FIG. 3B illustrates some examples of cross probing a simulation schematic with respect to a master schematic in one design fabric of multiple design fabrics in one or more embodiments. In these one or more embodiments, cross probing circuit components (e.g., 302B, 306B, and 310B) in a simulation schematic 350B automatically may invoke the master schematic 360B to highlight the corresponding circuit components (e.g., 304B, 308B, and 312B) in the master schematic 360B. Similarly, cross probing the corresponding circuit components (e.g., 304B, 308B, and 312B) in the master schematic 360B automatically may invoke simulation schematic to highlight the circuit components (e.g., 302B, 306B, and 310B) in a simulation schematic 350B.

Figure 4A:
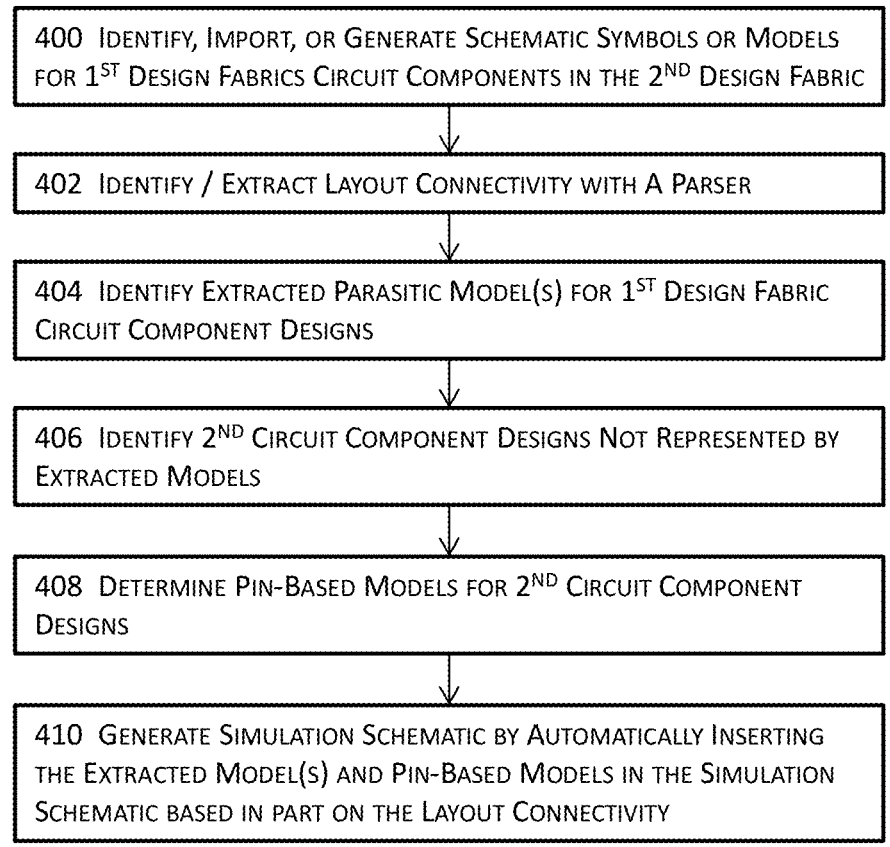
FIG. 4A illustrates a more detailed block diagram for constructing a simulation schematic of an electronic design across multiple design fabrics in one or more embodiments.

FIG. 4A illustrates a more detailed block diagram for constructing a simulation schematic of an electronic design across multiple design fabrics in one or more embodiments. In these one or more embodiments, one or more schematic cellview symbols or models for one or more first design fabric circuit component designs may be identified, imported, or generated for the second design fabric at 400. For example, a schematic cellview model for an IC package design in the IC package design fabric may be identified, imported, or generated for the IC design fabric.

Figure 4B:
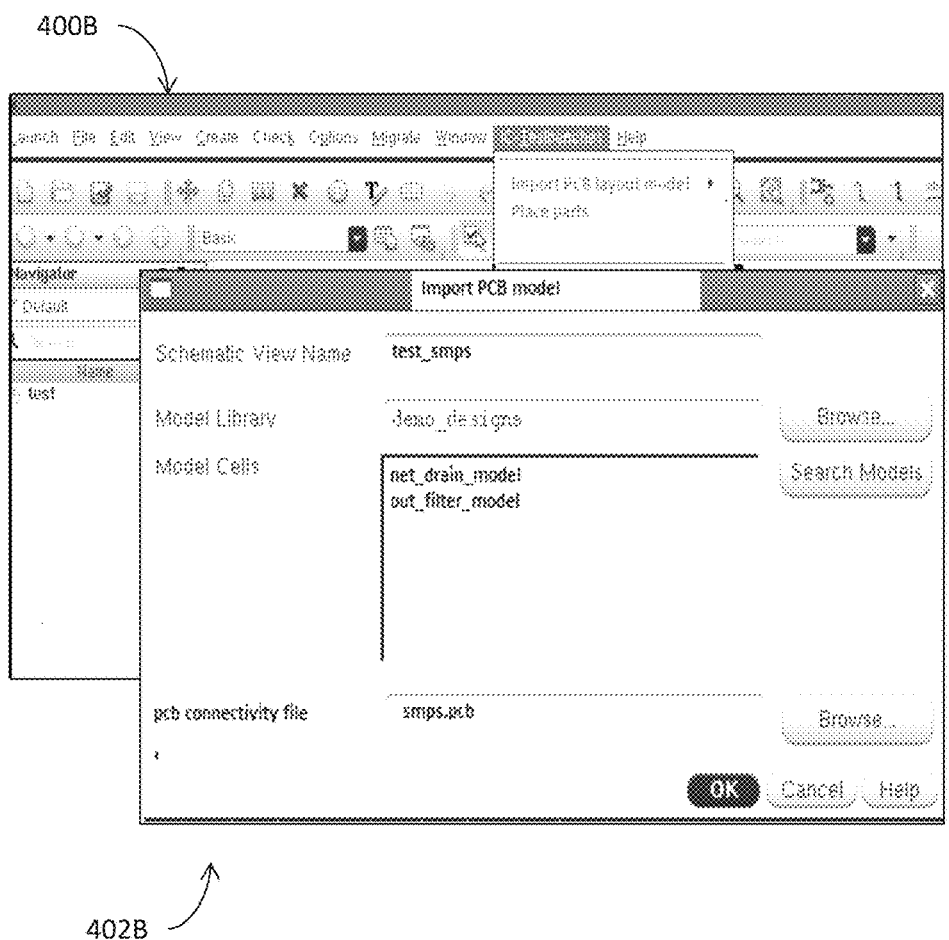
FIGS. 4B-G illustrate an example of constructing a simulation schematic of an electronic design across multiple design fabrics in one or more embodiments.

An example is illustrated in FIG. 4B, which illustrates an example of constructing a simulation schematic of an electronic design across multiple design fabrics in one or more embodiments. More specifically, FIG. 4B illustrates a user interface 400B for importing PCB libraries into an IC schematic editing mechanism to create the PCB schematic model and the IC package schematic models in the IC schematic editing mechanism in some embodiments. The user interface 400B further includes a toolbar which, when actuated, brings up a dialog box 402B for importing a PCB mode. The dialog box 402B includes, for example, the name of the schematic view 408B, the model library 404B, and the model cells 406B.

Layout connectivity may be identified or extracted at 402 from the layout for the one or more first design fabric circuit component designs. In some embodiments, a design parsing mechanism may be used to extract connectivity from a layout. Extracted models with or without parasitic information or embedded parasitic models may be identified at 404 for one or more circuit component designs in the first design fabric. One or more second circuit component designs in the first design fabric that do not correspond to extracted models may be identified at 406. For these second circuit design designs, one or more pin-based schematic models may be determined at 408.

In some embodiments, a pin-based schematic model includes a schematic symbol and identifications of pins or ports that are located at an interface and may be referenced in interconnecting the pin-based schematic model to one or more nets or net segments. At 410, a simulation schematic may be generated or updated by automatically inserting or placing the extracted models and the pin-based models into the simulation schematic based in part or in whole on connectivity information extracted at 402. In some embodiments, the extracted models and the pin-based models may be interconnected by flight-lines. In some of these embodiments, flight-lines may be constructed in a way to mimic the appearance of interconnects with 90-degree bends. In some other embodiments, flight-lines may be constructed with straight line segments connecting respective sources and destinations.

Figure 4C:
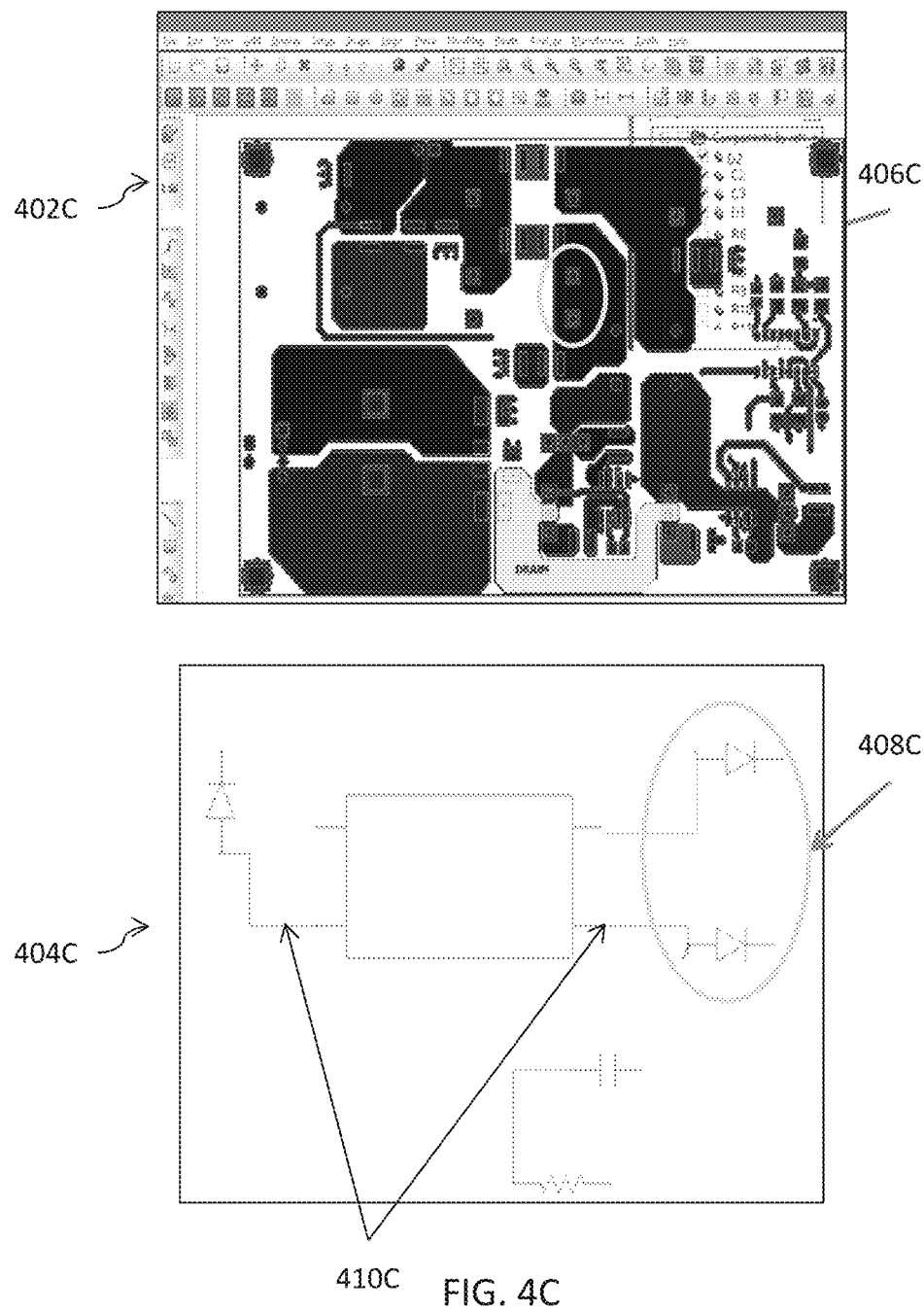

FIGS. 4C-G illustrates an example of constructing a simulation schematic of an electronic design across multiple design fabrics in one or more embodiments. FIG. 4C illustrates an example of constructing a parasitic aware simulation schematic from layouts across multiple design fabrics in some embodiments. More specifically, FIG. 4C illustrates a PCB layout 402C including two identified layout components 406C. FIG. 4C further includes a portion of a simulation schematic 404C constructed with some techniques described herein.

The simulation schematic 404C includes the schematic cellview symbol 406C for those two identified layout components 406C. The schematic cellview symbol 406C may be retrieved from, for example, a schematic cellview database and placed into the simulation schematic 404C. The simulation schematic 404C also comprises flight-lines 410C that may be automatically inserted based in part or in whole upon the connectivity extracted from the layout 402C. These flight-lines may be used to denote interconnection of various schematic models in the simulation schematic 404C.

Figure 4D:
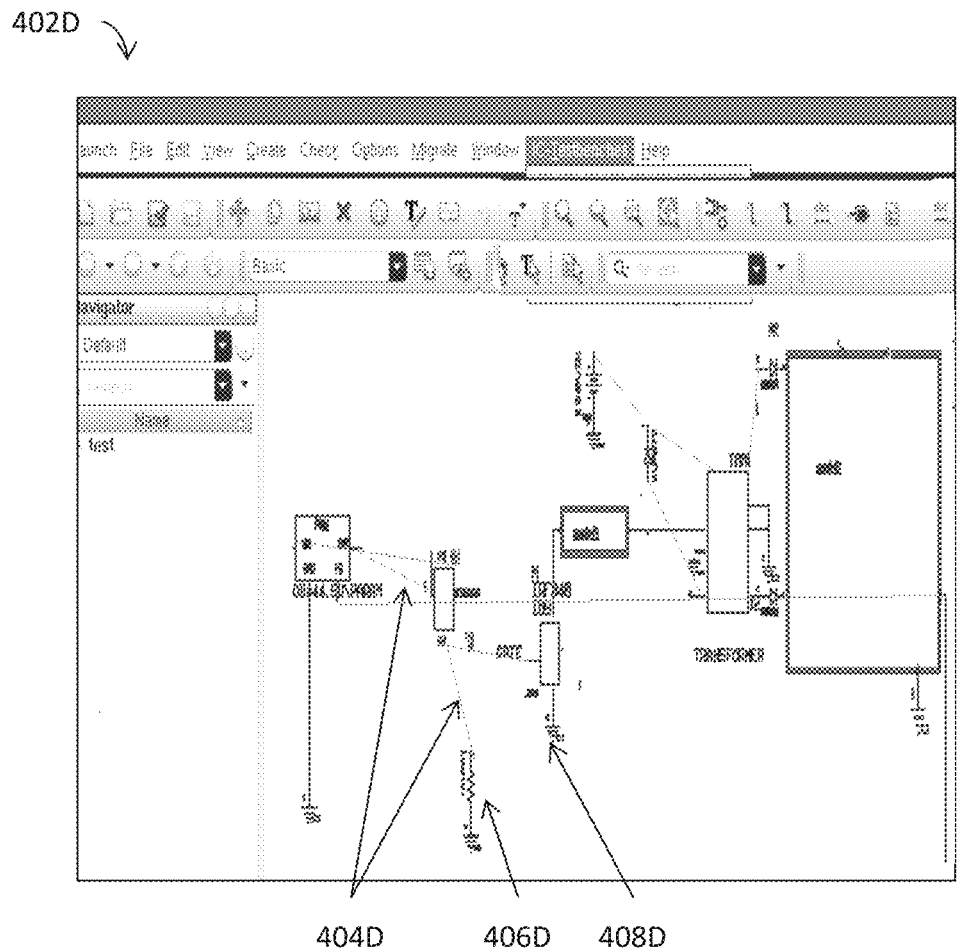

FIG. 4D illustrates a portion of a simulation schematic 402D that includes, among other circuit components, flight-lines 404D, a first parasitic model 406D (e.g., a resistor model), and a second parasitic model 408D (e.g., a capacitor model). In these embodiments illustrated in FIG. 4D, parasitic information may be annotated, stitched, or otherwise automatically inserted into a simulation schematic in the form of parasitic model as shown in FIG. 4D or may be embedded in extracted models (not shown in FIG. 4D) as described in some aforementioned examples.

Figure 4E:
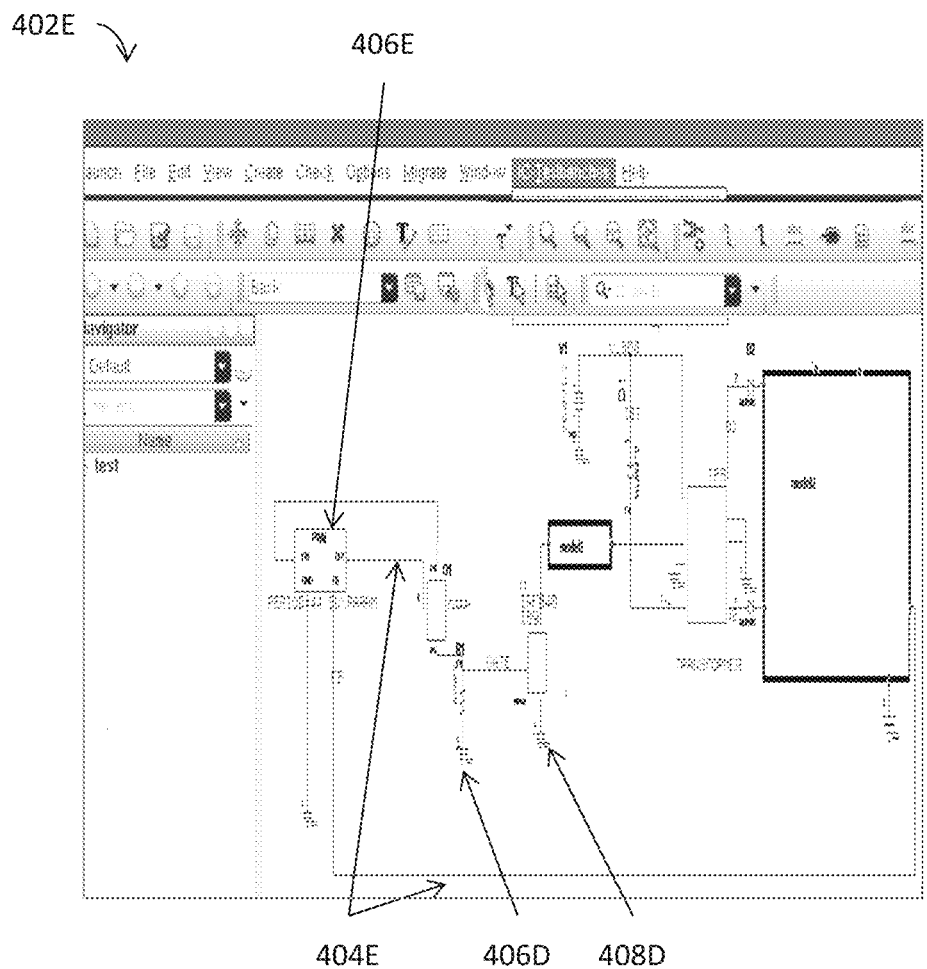

FIG. 4E illustrates a portion of a simulation schematic 402E that includes an IC package extracted model 406E, a first parasitic model 406D (e.g., a resistor model), and a second parasitic model 408D (e.g., a capacitor model). The portion of the simulation schematic 402E also includes a set of rectilinear flight-lines 404E, rather than straight flight-lines connecting respective sources and destinations as shown in FIG. 4D.

Figure 4F:
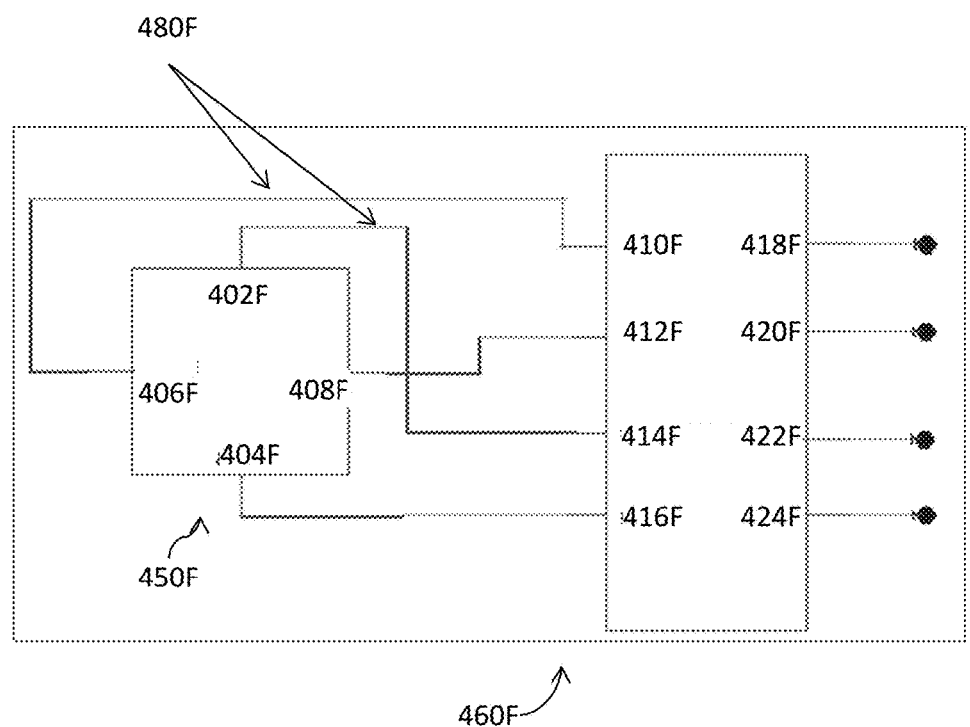

FIG. 4F illustrates an example of an extracted IC package model 460F with respect to the extracted IC model 450F. The extracted IC model 450F includes names or identifications of the pins or ports 402F, 404F, 406F, and 408F. These names or identifications of the extracted IC model 450F may be referenced in interconnecting the extracted IC model 450F to the corresponding ports or pins (e.g., 410F, 412F, 414F, and 416F) of the IC package model 460F. A set of rectilinear flight-lines 470F may be used to illustrate how the IC extracted model 450F is connected to the extracted IC package model 460F. The extracted IC package model 460F may further includes connectivity information (e.g., names or identifications of additional pins or ports 418F, 420F, 422F, and 424F) that may be referenced in connecting the extracted IC package model to external circuits.

Figure 4G:
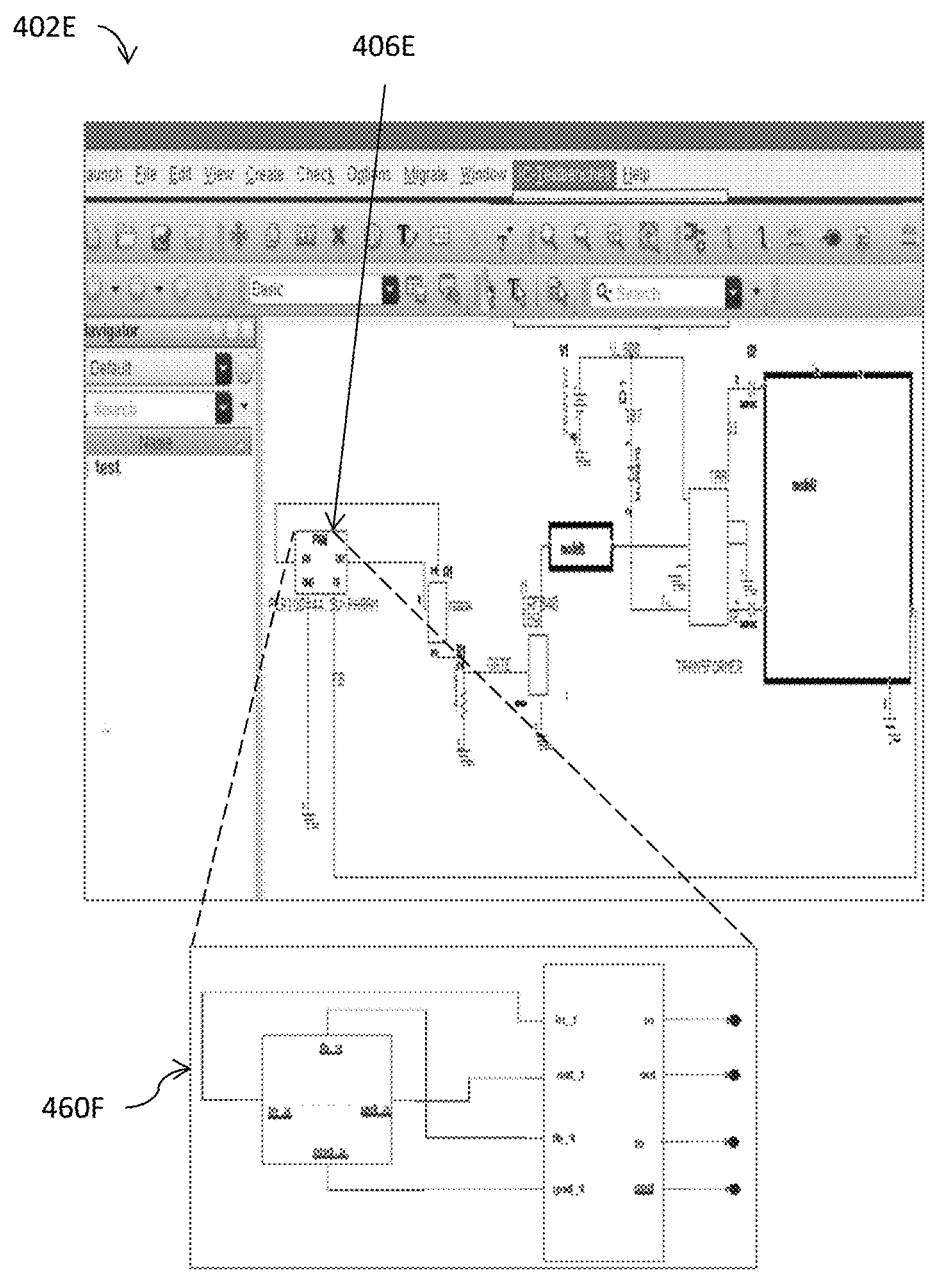

FIG. 4G illustrates the accommodation of the extracted IC package model 406E as a hierarchy under the simulation schematic 402E as well as the additional hierarchy 460F as another hierarchy under the IC package model 406E in some embodiments. In some other embodiments, the extracted IC package model 460F may be introduced to the simulation schematic 402E as flat circuit components, rather than as a hierarchical structure as illustrated in FIG. 4G.

FIG. 4H illustrates an example of a schematic design in one or more embodiments. The schematic design 400H may span across multiple sheets (402H, 404H, 406H, and 408H) and include multiple instances that are interconnected as shown in FIG. 4H. For example, sheet #1 (402H) of the schematic design may include instance "i1" and "i2"; sheet #2 (404H) of the schematic design may include instance "i3" and "i4; sheet #3 (406H) of the schematic design may include instance "i5" and "i6"; and sheet #4 (408H) of the schematic design may include instance "i7" and "i8".

These instances (i1 through i8) are interconnected with a plurality of nets (n1 through n12) as shown in FIG. 4H. For example, instance "i3" is connected to instances "i4", "i7", and "i2" via nets "n4", "n9", and "n3" respectively. FIG. 4I illustrates an example of the corresponding layout for the schematic design illustrated in FIG. 4H. In FIG. 4I, the nets "(n1" through "n12") represent actual, geometric wires or traces in the layout.

Figure 4J:
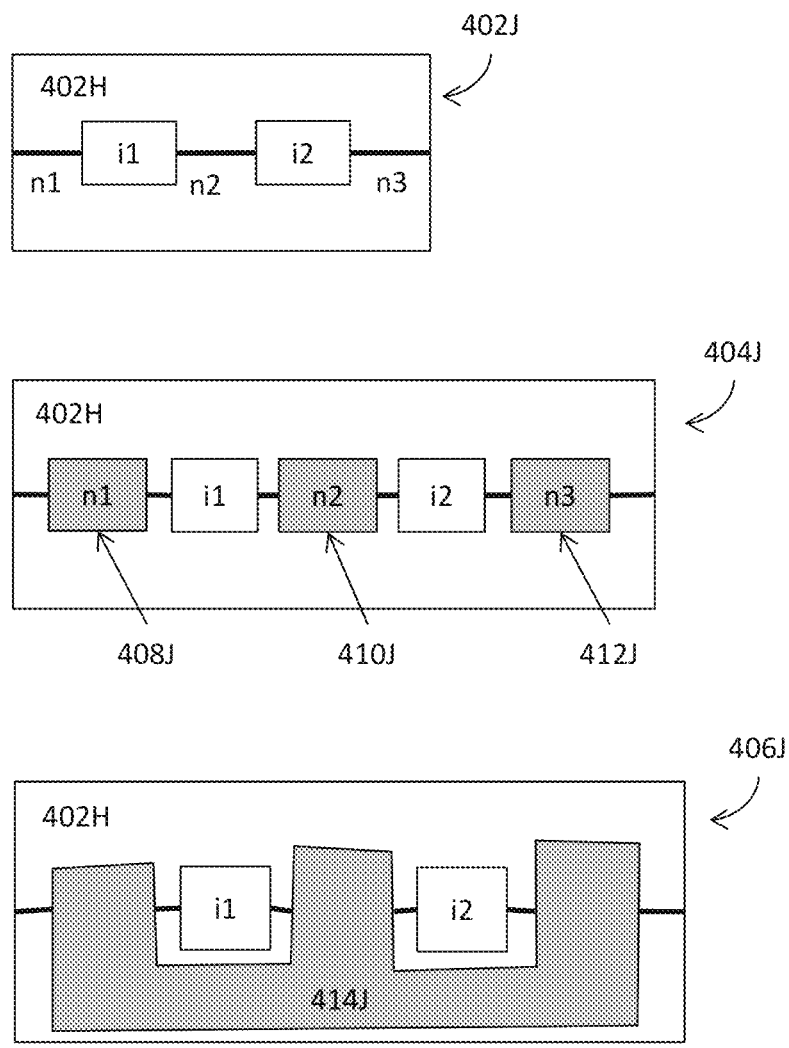

Various techniques describe herein provide the capability for extracting only the nets or segments thereof, only the circuit component designs but not nets, or both the nets and circuit component designs. In addition, the entire design may be extracted and represented in a model (e.g., an s-parameter model) in some embodiments. FIG. 4J illustrates some examples of extracting only the nets or segments thereof for a portion of the electronic design (e.g., sheet #1 402H in FIG. 4H) and representing the portion as one or more extracted models in one or more embodiments.

In these examples illustrated in FIG. 4J, only the nets ("n1", "n2", and "n3" in 402J are extracted and represented as their respective extracted models while the instances ("i1" and "i2") are not represented as extracted models (e.g., no available extracted models for these instances). 404J illustrates an example of representing each extracted circuit component design (the nets in this example) as an extracted model. For example, net "n1" is represented as an extracted model 408J in 404J; net "n2" is represented as an extracted model 410J in 404J; and net "n3" is represented as an extracted model 412J in 404J. 406J illustrates another example of representing all three extracted circuit component designs in a single extracted model, where the three nets ("n1", "n2", and "n3") are represented as a single model 414J (e.g., an s-parameter model) that connects to both instances "i1" and "i2".

Figure 4K:
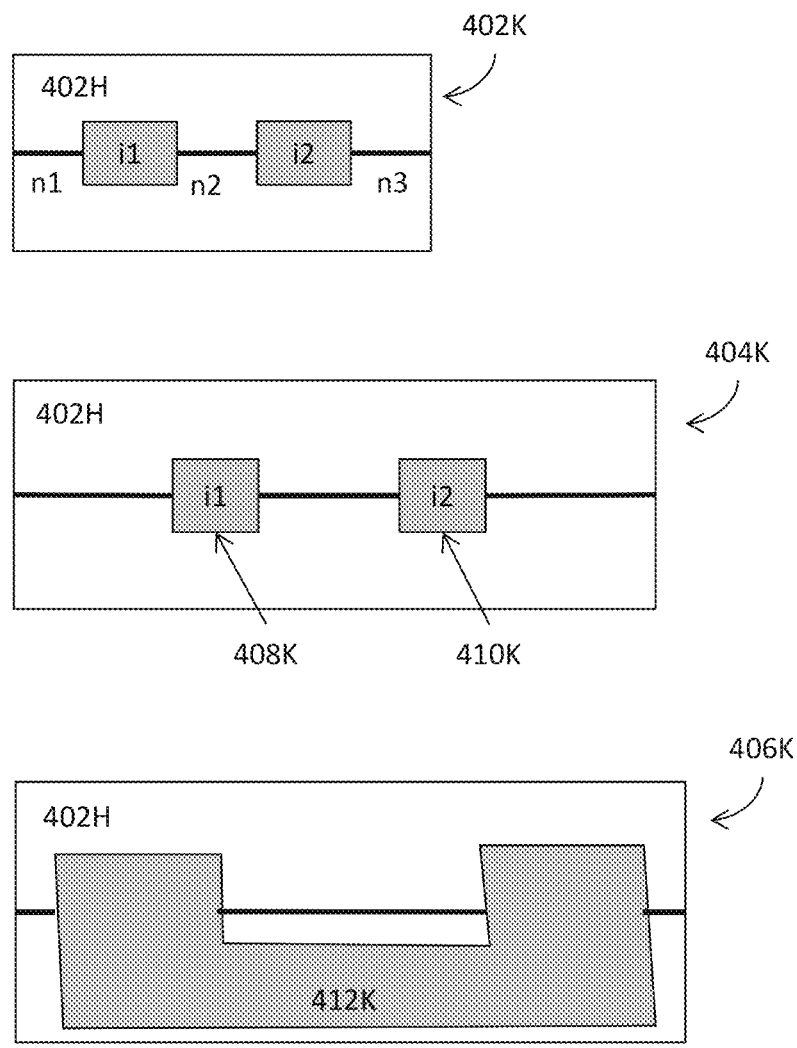

FIG. 4K illustrates some examples of extracting only the instances but not the nets or segments thereof for a portion of the electronic design (e.g., sheet #1 402H in FIG. 4H) and representing the portion with one or more extracted models in one or more embodiments. In these examples illustrated in FIG. 4K, only the instances ("i1" and "i2") in 402K are extracted and represented in one or more extracted models, but the nets ("n1", "n2", and "n3" in 402J) are not. 404K illustrates an example of representing each extracted circuit component design (the instances in this example) as an extracted model. In 404K, instance "i1" is represented as an extracted model 408K in 404K; and instance "i2" is represented as an extracted model 410K in 404K. 406K illustrates another example of representing both extracted circuit component designs in a single extracted model, where both instances ("i1" and "i2") are represented as a single model 412K (e.g., an s-parameter model) that connects to all three nets "n1", "n2", and "n3".

Figure 4L:
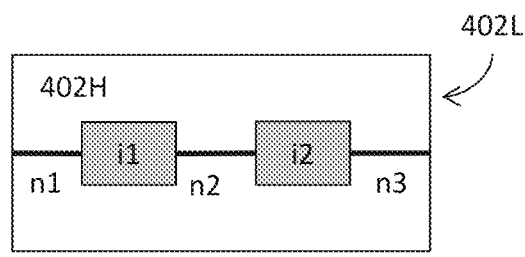
Figure 4L:
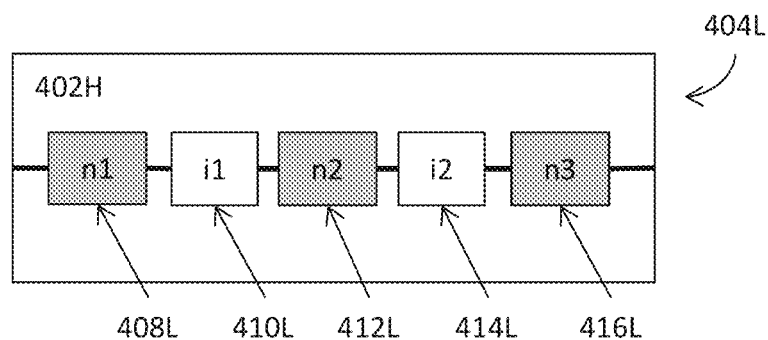
Figure 4L:
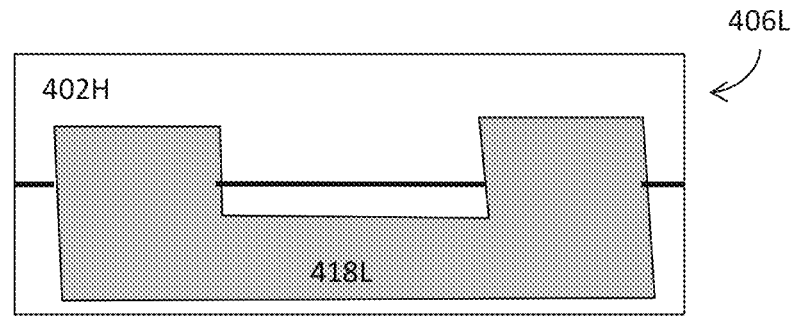

FIG. 4L illustrates some examples of extracting both the instances and the nets or segments thereof for a portion of the electronic design (e.g., sheet #1 402H in FIG. 4H) and representing the portion with one or more extracted models in one or more embodiments. In these examples illustrated in FIG. 4L, both the instances ("i1" and "i2") and the nets ("n1", "n2", and "n3") in 402L are extracted and represented in one or more extracted models. 404L illustrates an example of representing each extracted circuit component design (the instances in this example) as an extracted model.

For example, instance "i1" is represented as an extracted model 410L in 404L; and instance "i2" is represented as an extracted model 414L in 404L; net "n1" is represented as an extracted model 408L in 404L; net "n2" is represented as an extracted model 412L in 404L; and net "n3" is represented as an extracted model 416L in 404L. 406L illustrates another example of representing all the extracted circuit component designs in a single extracted model, where both instances ("i1" and "i2") and all three nets ("n1", "n2", and "n3") are jointly represented as a single model 418L (e.g., an s-parameter model). These examples illustrated in FIGS. 4H-L demonstrate the flexibility in the extraction and representation of circuit component designs with one or more extracted models.

In some other embodiments, a single component design with the one or more associated nets or segments thereof may be extracted and represented in a model. In addition or in the alternative, cross-coupling effects between nets may be accounted for in the model representing the electronic design or a portion thereof. For example, the electromagnetic coupling effects between the nets "n2" and "n10" may be accommodated in the model representing at least instance "i1" or "i2", the model representing instance "i6" or "i7", or in the model representing at least one of instances "i1" and instance "i2" and at least one of instances "i6" and "i7".

System Architecture Overview

Figure 5:
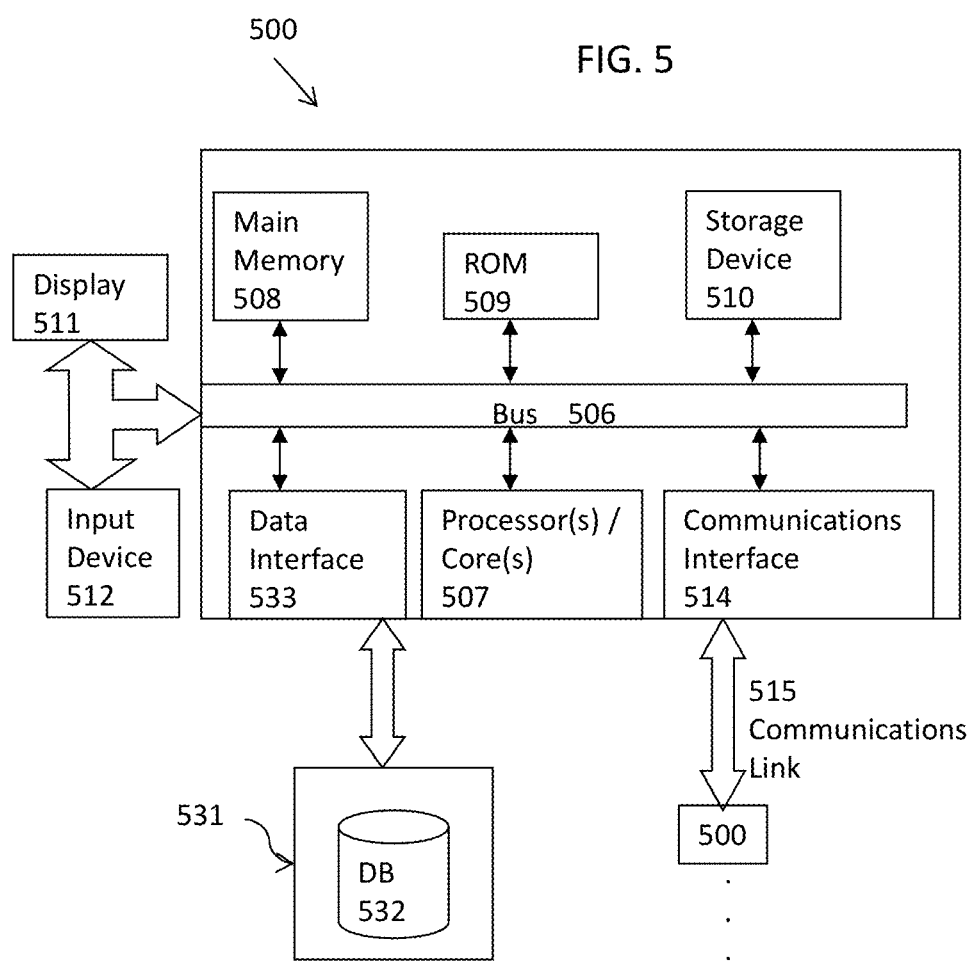
FIG. 5 illustrates a computerized system on which a method for constructing a simulation schematic of an electronic design across multiple design fabrics may be implemented.

FIG. 5 illustrates a block diagram of an illustrative computing system 500 suitable for constructing a simulation schematic of an electronic design across multiple design fabrics as described in the preceding paragraphs with reference to various figures. Computer system 500 includes a bus 506 or other communication mechanism for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computing system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A mechanisms described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, i.e., application code, through communication link 515 and communication interface 514. Received program code may be executed by processor 507 as it is received, and/or stored in disk drive 510, or other non-volatile storage for later execution. In an embodiment, the computing system 500 operates in conjunction with a data storage system 531, e.g., a data storage system 531 that includes a database 532 that is readily accessible by the computing system 500. The computing system 500 communicates with the data storage system 531 through a data interface 533. A data interface 533, which is coupled with the bus 506, transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for generating a parasitic-aware simulation schematic across multiple design fabrics, comprising:
    identifying or generating a data structure that comprises a list of circuit design components in an electronic design spanning across multiple design fabrics;
    removing at least a first circuit component design from the data structure at least by identifying, with a multi-fabric implementation mechanism that is stored at least partially in memory of and includes or is coupled with at least one micro-processor of a computing system, a first extracted model from existing extracted models for the first circuit component design in a first layout in a first design fabric of an electronic design that spans across multiple design fabrics;
    generating a simulation schematic by inserting the first extracted model into the simulation schematic;
    performing a simulation with the simulation schematic to generate a simulation result; and
    updating the electronic design for manufacturing based in part or in whole upon the simulation result.

2. The computer implemented method of claim 1, further comprising:
    constructing a second extracted model for a second circuit component design that corresponds to no extracted models; and
    updating the simulation schematic by inserting the second extracted model into the simulation schematic.

3. The computer implemented method of claim 2, further comprising:
    cross probing at least a portion of the first design fabric and a second design fabric of the multiple design fabrics to generate first connectivity information; and
    interconnecting the first extracted model and the second extracted model based in part or in whole upon the first connectivity information.

4. The computer implemented method of claim 2, wherein the second circuit component design is situated in a second design fabric of the multiple design fabrics, and the first design fabric and the second design fabric include two of an integrated circuit (IC) design fabric, an IC package design fabric, and a printed circuit board (PCB) design fabric.

5. The computer implemented method of claim 2, further comprising:
    identifying a schematic cellview symbol for the second circuit component design from a schematic cellview symbol data structure stored in a non-transitory computer accessible storage medium; and
    extracting third connectivity information for the second circuit component design.

6. The computer implemented method of claim 5, further comprising:
    extracting parasitic information for the second circuit component design; and
    constructing the second extracted model by associating at least the third connectivity information and the parasitic information with the schematic cellview symbol.

7. The computer implemented method of claim 1, further comprising:
    identifying one or more schematic models for one or more third circuit component designs in one or more layouts in the multiple design fabrics; and
    extracting second connectivity information for the one or more third circuit component designs.

8. The computer implemented method of claim 7, further comprising:
updating the simulation schematic by inserting the one or more schematic models into the simulation schematic; and
interconnecting the first extracted model to at least one schematic model of the one or more schematic models based in part or in whole upon the second connectivity.

9. The computer implemented method of claim 1, further comprising:
receiving a first request for identifying a first circuit component design in the simulation schematic;
automatically identifying a first corresponding circuit component design in a master schematic design; and
presenting the first corresponding circuit component design with a first textual or graphical emphasis in the master schematic design.

10. The computer implemented method of claim 1, further comprising:
receiving a second request for identifying a parasitic model in the simulation schematic;
automatically identifying a second circuit component design in the master schematic design or a master layout, the second circuit component design corresponding to the parasitic model that has been identified; and
presenting the second corresponding circuit component design with a second textual or graphical emphasis in the master schematic design or the master layout.

11. The computer implemented method of claim 1, further comprising:
performing a layout versus schematic check with at least the first layout and the simulation schematic.

12. The computer implemented method of claim 1, further comprising:
identifying a first schematic design in one design fabric of the multiple design fabrics; and
perform a schematic versus schematic check with at least the first schematic design and the simulation schematic.

13. A system for generating a parasitic-aware simulation schematic across multiple design fabrics, comprising:
a plurality of mechanisms, at least one of which comprises at least one microprocessor including one or more processor cores executing one or more threads in a computing system;
a non-transitory computer accessible storage medium storing thereupon program code that includes a sequence of instructions that, when executed by the at least one micro-processor or processor core of a computing system, causes the at least one micro-processor or processor core at least to:
identify or generate a data structure that comprises a list of circuit design components in an electronic design spanning across multiple design fabrics;
remove at least a first circuit component design from the data structure at least by identifying, with a multi-fabric implementation mechanism that is stored at least partially in memory of and includes or coupled with at least one micro-processor of a computing system, a first extracted model from existing extracted models for the first circuit component design in a first layout in a first design fabric of an electronic design that spans across multiple design fabrics;
generate a simulation schematic by inserting the first extracted model into the simulation schematic;
perform a simulation with the simulation schematic to generate a simulation result; and
update the electronic design for manufacturing based in part or in whole upon the simulation result.

14. The system of claim 13, wherein the program code includes further instructions that, when executed by the at least one micro-processor or processor core, cause the at least one processor or processor core to:
construct a second extracted model for a second circuit component design that corresponds to no extracted models; and
update the simulation schematic by inserting the second extracted model into the simulation schematic.

15. The system of claim 14, wherein the program code includes further instructions that, when executed by the at least one micro-processor or processor core, cause the at least one processor or processor core to:
cross probe at least a portion of the first design fabric and a second design fabric of the multiple design fabrics to generate first connectivity information; and
interconnect the first extracted model and the second extracted model based in part or in whole upon the first connectivity information.

16. The system of claim 14, wherein the program code includes further instructions that, when executed by the at least one micro-processor or processor core, cause the at least one processor or processor core to:
identify a schematic cellview symbol for the second circuit component design from a schematic cellview symbol data structure stored in a non-transitory computer accessible storage medium;
extract third connectivity information for the second circuit component design;
extract parasitic information for the second circuit component design; and
construct the second extracted model by associating at least the third connectivity information and the parasitic information with the schematic cellview symbol.

17. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for generating a parasitic-aware simulation schematic across multiple design fabrics, the set of acts comprising:
identifying or generating a data structure that comprises a list of circuit design components in an electronic design spanning across multiple design fabrics;
removing at least a first circuit component design from the data structure at least by identifying, with a multi-fabric implementation mechanism that is stored at least partially in memory of and includes or is coupled with at least one micro-processor of a computing system, a first extracted model from existing extracted models for the first circuit component design in a first layout in a first design fabric of an electronic design that spans across multiple design fabrics;
generating a simulation schematic by inserting the first extracted model into the simulation schematic;
performing a simulation with the simulation schematic to generate a simulation result; and
updating the electronic design for manufacturing based in part or in whole upon the simulation result.

18. The article of manufacture of claim 17, the set of acts further comprising:
identifying one or more schematic models for one or more third circuit component designs in one or more layouts in the multiple design fabrics; and extracting second connectivity information for the one or more third circuit component designs.

19. The article of manufacture of claim 18, the set of acts further comprising:

updating the simulation schematic by inserting the one or more schematic models into the simulation schematic; and interconnecting the first extracted model to at least one schematic model of the one or more schematic models based in part or in whole upon the second connectivity.

20. The article of manufacture of claim 19, the set of acts further comprising:

receiving a second request for identifying a parasitic model in the simulation schematic;

automatically identifying a second circuit component design in the master schematic design or a master layout, the second circuit component design corresponding to the parasitic model that has been identified; and presenting the second corresponding circuit component design with a second textual or graphical emphasis in the master schematic design or the master layout.

21. The article of manufacture of claim 19, the set of acts further comprising:

extracting connectivity information for the electronic design spanning across the multiple design fabrics;

representing at least a part of the connectivity information as one or more flight-lines that span across more than one design fabric of the multiple design fabrics; and guiding placement of the first extracted model in the simulation schematic with at least the one or more flight-lines based in part or in whole upon the connectivity information.

* * * * *